United States Patent
Yitzchaik

(10) Patent No.: US 6,808,803 B1
(45) Date of Patent: Oct. 26, 2004

(54) MOLECULAR EPITAXY METHOD AND COMPOSITIONS

(75) Inventor: Shlomo Yitzchaik, Jerusalem (IL)

(73) Assignee: Yissum Research Development Company of the Hebrew University of Jerusalem, Jerusalem (IL)

( * ) Notice: Subject to any disclaimer, the term of this patent is extended or adjusted under 35 U.S.C. 154(b) by 0 days.

(21) Appl. No.: 10/600,641

(22) Filed: Jun. 23, 2003

Related U.S. Application Data

(60) Division of application No. 09/966,745, filed on Oct. 1, 2001, which is a continuation-in-part of application No. 09/273,659, filed on Mar. 23, 1999, now Pat. No. 6,316,098
(60) Provisional application No. 60/079,699, filed on Mar. 27, 1998.

(51) Int. Cl.[7] ............................................... B32B 5/04
(52) U.S. Cl. ...................... 428/339; 428/338; 428/332; 437/64; 437/26; 437/77; 117/84; 117/99
(58) Field of Search ........................... 428/339, 338, 428/332; 437/64, 26, 77; 117/84, 99

(56) References Cited

U.S. PATENT DOCUMENTS

| | | |
|---|---|---|
| 4,342,945 A | 8/1982 | Ketchpel |
| 4,391,888 A | 7/1983 | Chang et al. |
| 4,690,750 A | 9/1987 | Roxlo et al. |
| 4,703,096 A | 10/1987 | Choe |
| 4,746,181 A | 5/1988 | Hayakawa et al. |
| 4,859,625 A | 8/1989 | Matsumoto |
| 5,076,860 A | 12/1991 | Ohba et al. |
| 5,079,594 A | 1/1992 | Mitsuyu et al. |
| 5,155,566 A | 10/1992 | Nakayama et al. |
| 5,166,100 A | 11/1992 | Gossard et al. |
| 5,240,762 A | 8/1993 | Miura et al. |
| 5,254,207 A | 10/1993 | Nishizawa et al. |
| 5,274,246 A | 12/1993 | Hopkins et al. |
| 5,284,779 A | 2/1994 | Miyanga |
| 5,296,403 A | 3/1994 | Nishizawa et al. |
| 5,349,209 A | 9/1994 | Moyer et al. |
| 5,374,570 A | 12/1994 | Nasu et al. |
| 5,383,212 A | 1/1995 | Knox et al. |
| 5,401,615 A | 3/1995 | Pai et al. |
| 5,424,560 A | 6/1995 | Norman et al. |
| 5,434,102 A | 7/1995 | Watanabe et al. |
| 5,532,511 A | 7/1996 | Nishizawa et al. |
| 5,532,550 A | 7/1996 | Adler |
| 5,541,478 A | 7/1996 | Troxell et al. |
| 5,587,329 A | 12/1996 | Hseuh et al. |
| 5,612,549 A | 3/1997 | Nelson et al. |
| 5,614,435 A | 3/1997 | Petroff et al. |
| 5,623,476 A | 4/1997 | Eguchi et al. |
| 5,641,611 A | 6/1997 | Shieh et al. |
| 5,656,508 A | 8/1997 | So et al. |
| 5,677,545 A | 10/1997 | Shi et al. |
| 5,681,756 A | 10/1997 | Norman et al. |
| 5,692,075 A | 11/1997 | Hwang et al. |
| 5,693,139 A | 12/1997 | Nishizawa et al. |
| 5,693,962 A | 12/1997 | Shi et al. |
| 5,707,745 A | 1/1998 | Forrest et al. |

OTHER PUBLICATIONS

Agranovich et al, "Fermi resonance interface modes in organic multilayer structures", *Chem Phys Lett* 210(4,5,6):458–462 (1993).
Anderson et al, "Synthesis and Third–Order Nonlinear Optical Properties of a Conjugated Porphyrin Polymer", *Angew Chem Int Ed Eng* 33(6):655–657 (1994).

(List continued on next page.)

*Primary Examiner*—Duc Truong
(74) *Attorney, Agent, or Firm*—Browdy and Neimark, P.L.L.C.

(57) ABSTRACT

Organic superlattices formed by molecular layer epitaxy (MLE), and a novel MLE method of forming organic molecular monolayers are disclosed. The method utilized covalent linkage, combined with self-cleaning layer growth, to form pi-stacked, ordered, oriented monomolecular layers for use in a variety of electronic applications.

12 Claims, 16 Drawing Sheets

OTHER PUBLICATIONS

Bird et al, "Velocity Distributions in Laminar Flow", in *Transport Phenomena* Wiley, New York, NY, Chapter 2, pp. 34–70 (1960).

Braun et al, "Visible light emission from semiconducting polymer diodes", *Appl Phys Lett* 58:1982–1984 (1991).

Braun et al, "Electroluminescence and electrical transport in poly(3–octylthiophene)", *J Appl Phys* 72(2):564–568 (1992).

Burn et al, "Chemical tuning of electroluminescent copolymers to improve emission efficiencies and allow patterning", *Nature* 356:47–49 (1992).

Burroughes et al "Light–emitting diodes based on conjugated polymers", *Nature* 347:539–541 (1990).

Chemla et al, "Room Temperature Excitonic Nonlinear Absorption and Refraction in GaAs/AlGaAs Multiple Quantum Well Structures", *IEEE J Quantum Electron* QE–20:265–275 (1984).

Donovan et al, "Determination of anisotropic electron transport properties of two Langmuir–Blodgett organic multiple quantum wells", *Thin Solid Films* 244:110–114 (1993).

Donovan et al, "Determination of the parallel and perpendicular intermolecular tunneling rates in two Langmuir-Blodgett quantum well systems" *Thin Solid Films* 232:923–927 (1994).

Forrest et al, "Ultrahigh–vacuum quasiepitaxial growth of model van der Waals thin films. II. Experimental", *Phys Rev B* 49(16):11309–111321 (1994).

Greenham et al, "Efficient light–emitting diodes based on polymers with high electron affinities", *Nature* 365:628–630 (1993).

Haskal et al, "Finite size effects observed in the fluorescence of ultrathin crystalline organic films grown by organic molecular beam deposition", *Chem Phys Lett* 219:325–330 (1994).

Haskal et al, "Excitons and exciton confinement in crystalline organic thin films grown by organic molecular–beam deposition", *Phys Rev* B51:4449–4462 (1995).

Hiramoto et al, "Directed beam emission from film edge in organic electroluminescent diode", *Appl Phys Lett* 62(7):666–668 (1993).

Hong et al, "Possible evidence for quantum–size effects in self–assembled ultrathin films containing conjugated copolymers", *Appl Phys* 79(6):3082–3088 (1996).

Jenekhe et al, "Excimers and Exciplexes of Conjugated Polymers", *Science* 265:765–768 (1994).

Kido et al, "Bright blue electroluminescence from poly (N–vinylcarbazole)", *Appl Phys Lett* 63(19):2627–2629 (1993).

Kido et al, "White light–emitting organic electroluminescent devices using the poly(N–vinylcarbazole) emitter layer doped with three fluorescent dyes", *Appl Phys Lett* 64:815–817 (1994).

Kubono et al, "Polymer Thin Films by Vapor Deposition", *Prog Polym Sci* 19:389–438 (1994).

Lam et al, "Optical Nonlinearities in Crystalline Organic Multiple Quantum Wells", *Phys Rev Lett* 60(12):1614–1617 (1991).

Li et al, "Chromophoric Sell–Assembled Multilayers. Organic Superlattice Approaches to Thin–Films Nonlinear Optical Materials", *J Am Chem Soc* 112:7389–7390 (1990).

Maruo et al, Surface characterization of fluorinated polyimde films grown by vapor deposition polymerization, *J Vac Soc Technol A* 11(5):2590–2596 (1993).

Naiwa HS, "Organic Materials for Third–Order Nonlinear Optics", *Adv Mater* 5(5):341–358 (1993).

Ohmori et al, "Observation of spectral narrowing and emission energy shift in organic electroluminescent diode utilizing 8–hydroxyquinoline aluminum/aromatic diamine multilayer structure", *Appl Phys Lett* 63(14):1871–1873 (1993).

Osaheni et al, "Efficient Blue Luminescence of a Conjugated Polymer Exciplex", *Macromolecules* 27:739–742 (1994).

Pessa et al, "Characterization of surface exchange reactions used to grow compound films", *Appl Phys Lett* 38(3):131–132 (1981).

Shirota et al, "Multilayered organic electroluminescent device using a novel starburst molecule, 4,4', 4"–tris(3–methylphenylphenylamino)triphenylamine, as a hole transport material", *Appl Phys Lett* 65(7):807–809 (1994).

So et al, "Quasi–epitaxial growth of organic multiple quantum well structures by organic molecular beam deposition", *App Phys Lett* 56(7):674–676 (1990).

So et al, "Growth and Characterization of Organic Semiconductor Heterojunctions and Multiple Quantum Wells", *SPIE* 1285:95–103 (1990).

So et al, "Evidence for Exciton Confinement in Crystalline Organic Multiple Quantum Wells", *Phys Rev Lett* 66(20):2649–2652 (1991).

Takahashi et al, "Preparation of Ultrathin Films of Aromatic Polyamides and Aromatic Poly(amide–imides) by Vapor Deposition Polymerization" *Macromolecules* 24:3543–3546 (1991).

Tanaka et al, "Doping effect on organic semiconductive thin film by plasma polymerization of 3,4,9,,10–perylenetetracarboxyic dianhydride", *Synthetic Metals* 65:81–84 (1994).

Tatsuura et al, "Electro–optic polymer waveguide fabricated using electric–field–assisted chemical vapor deposition", *Appl Phys Lett* 60(14):1661–1663 (1992).

Ulman A, "Formation and Structure of Self–Assembled Monolayers", *Chem Rev* 96:1533–1554 (1996).

Wang et al, "Dependence on Piezoelectric and Pyroelectric Activities of Aromatic Polyurea Thin Films on Monomer Composition Ratio", *Jap J Appl Phys* 32:2768–2773 (1993).

Yitzchaik S, "Chromophoric Self–Assembled NLO Multilayer Materials. Real Time Observation of Monolayer Growth and Microstructural Evolution by in Situ Second Harmonic Generation Techniques", *J Phys Chem* 97:6958–6960 (1993).

Yoshimura et al, "Polymer films formed with monolayer growth steps by molecular layer deposition", *Appl Phys Lett* 59(4):482–484 (1991).

Yoshimura et al, "Quantum wire and dot formation by chemical vapor deposition and molecular layer deposition of one–dimensional conjugated polymer", *Appl Phys Lett* 60(3):268–270 (1992).

Zakhidov et al, "Polarization double barriers at the Interfaces in organic multilayered structures and superlattices", *Synthetic Metals* 64:155–165 (1994).

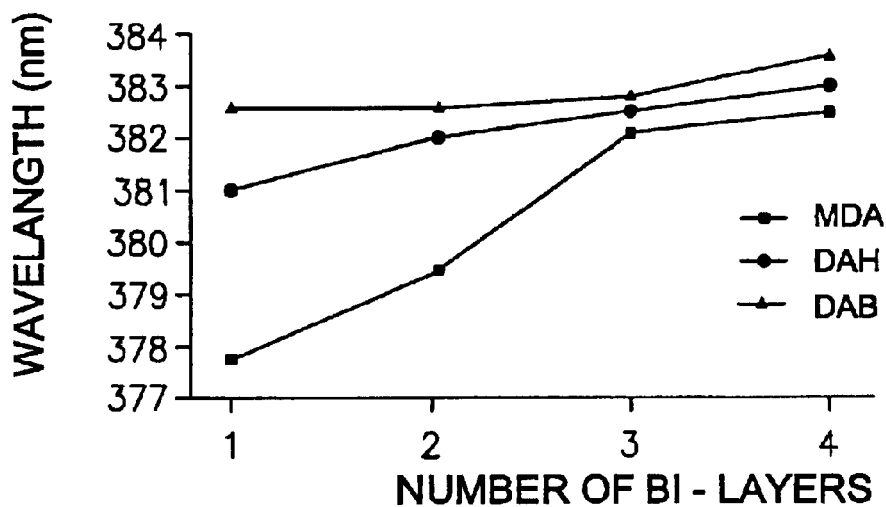
FIG. 9
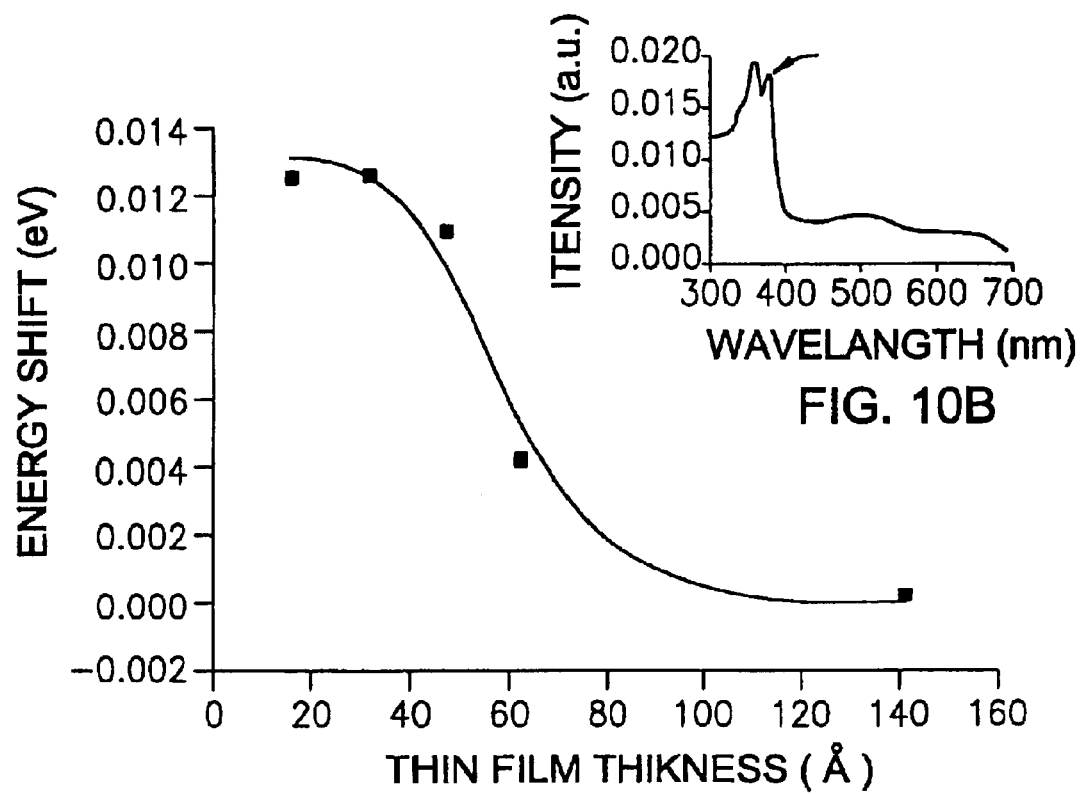
FIG. 10B
FIG. 10A

MOLECULAR EPITAXY METHOD AND COMPOSITIONS

CROSS-REFERENCE TO RELATED APPLICATIONS

The present application is a division of U.S. application Ser. No. 09/966,745, filed Oct. 1, 2001 now allowed, which is a continuation-in-part of U.S. application Ser. No. 09/273,659, filed Mar. 23, 1999, now U.S. Pat. No. 6,316,098, which claims benefit of U.S. provisional application 60/079,699, filed Mar. 27, 1998.

FIELD OF THE INVENTION

The present invention relates to molecular monolayers compositions and methods of forming the same.

BACKGROUND OF THE INVENTION

The interest in two-dimensional (2D) materials results from the fact that optoelectronics and molecular electronics have become frontier areas of material science (Ulman, 1991). Multilayered organic structures have recently received theoretical (Lam et al, 1991) and experimental (So et al, 1991; Forrest et al, 1994; Haskal et al, 1994; Ohmori et al, 1993; Yoshimura et al, 1991; Yoshimura et al 1992; Donovan et al, 1994; Donovan et al, 1993) treatment. Novel and applicable photophysical properties of organic superlattices have been predicted, including enhancement of optical nonlinearities (Lam et al, 1991; Zakhidov and Yoshino, 1994) and photoelectric transformations (Zakhidov and Yoshino, 1994). Techniques such as organic molecular beam deposition (OMBD) (So et al, 1991; Forrest et al, 1994; Haskal et al, 1994; Ohmori et al, 1993) have already proved the capability of growing ultrathin layers having the quality of inorganic quantum well (QW) structures.

A number of interesting optical and photophysical phenomena have already been found in OMBD derived organic QW, including the observation of exciton confinement in photoluminescence (PL) (So et al, 1991; Forrest et al, 1994) and electroluminescence (EL) and electric field modulation of PL (Ohmori et al, 1993). Preparation of crystalline thin organic films by the OMBD relies on the bonding of molecular layers via weak van der Waals forces to achieve and preserve quasi-epitaxial structures (Forrest et al, 1994). Thus, perfect monolayers without step edges cannot be achieved and the lower limit is an average of three "monomolecular", layers. A solution to these limitations can be found in another ultrahigh vacuum (UHV) technique: molecular layer deposition (MLD) (Yoshimura et al, 1991; Yoshimura et al, 1992). MLD demonstrated the construction of quantum dots and quantum wires and the potential use of functionalized organic precursors to form alternating multilayered structures. This approach is similar to (inorganic) atomic layer deposition (ALD) (Pessa et al, 1981) and the solution analog-molecular self-assembly (MSA) (Ulman, 1991).

A solution derived method to produce 2D layered structures, the Langmuir-Blodgett (LB) technique, yields films exhibiting anisotropic electron transport (Donovan et al, 1994) and tunneling (Donovan et al, 1993), again suggesting QW behavior. While the LB method is useful in achieving 2D multilayered physiadsorbed structures, LB films suffer from low chemical and thermal stability and cannot incorporate large chromophores without phase-segregation and micro-crystal formation. Alternatively, the trichlorosilane-based MSA approach 1 provides the advantages of strong chemiadsorption through Si—O bonds, chemical and thermal stability, and the ability to form non-centrosymmetric structures (Yitzchaik et al, 1993; Li et al, 1990).

Vapor phase growth techniques (Kubono et al, 1994) such as vapor deposition polymerization (VDP) of thin films was recently demonstrated for aromatic polymers such as polyimides (Maruo et al, 1993), polyamides (Takahashi et al, 1991), polyureas (Wang et al, 1933), and polyether-amines (Tatsuura et al, 1992). In the VDP process, two types of monomers are evaporated onto the surface of a substrate in a vacuum chamber. Condensation or addition polymerization then takes place between deposited monomers to produce thin polymeric films. Thin polymer films of high quality and uniformity can be fabricated by this process (Maruo et al, 1993; Takahashi et al, 1991). Thermally stable piezo- and pyro-electrical properties were found in poled samples (Wang et al, 1993). Moreover, electric field assisted VDP (in situ poling of hyperpolarizable monomers) was employed to fabricate electro-optic polymer waveguides (Tatsuura et al, 1992).

SUMMARY OF THE INVENTION

In one aspect, the invention includes a method of forming a multilayered structure composed of two or more discrete monomolecular layers, where at least one layer is composed of molecules of a selected polycyclic aromatic compound having a defined axis oriented substantially upright with respect to the plane of the monolayer, e.g., normal to the plane, or within up to 54° of normal. The said axis is typically the molecule's z axis, namely, the longest axis of the molecule. The method includes depositing molecules of a selected aromatic compound, preferably a polycyclic aromatic compound, having a defined axis with a chemically reactive group at each axial end, by vapor phase deposition, onto a substrate having surface-reactive sites capable of reacting with the chemically reactive group in the selected compound. The deposition step is carried under conditions which allow chemiadsorption of the selected compound in a molecular monolayer, by covalent coupling of one end of the compound to the substrate, and sublimation of non-covalently bonded compounds from the surface. There is formed by the deposition step a monomolecular layer of the selected compound. For some applications of the multilayered structures of the invention it may be preferable that the monolayer formed by the said deposition is characterized by in-plane compound ordering. These steps are carried out one or more times, where the monomolecular layer formed at each deposition cycle forms a new substrate having a surface-exposed monolayer with exposed reactive groups.

In one general embodiment, the method includes reacting the surface-exposed monolayer with a bifunctional reagent that reacts with the exposed reactive groups forming the just-deposited layer, to produce a coupling layer having exposed reactive groups with which the reactive groups of the selected compound forming the next monolayer can react.

For example, the surface-reactive groups on the substrate may be amine groups, and the bifunctional reagent may be a diamine compound. In this embodiment, the selected compound may be, for example, a polycyclic tetracarboxylic-dianhydride compound, capable of forming axial-end imide linkages, a polycyclic diacyl halide, capable of forming axial-end amide linkages, a polycyclic dialdehyde, capable of forming axial-end Schiff base linkages, and a polycyclic diisocyanate, capable of forming axial-end urea linkages.

The deposition in such an embodiment may be carried out, for example, N times in succession with one selected polycyclic compound, and M times in succession for a second selected polycyclic compound, to form a N monolayers of the one compound, and M monolayers of the other compound. The first and second polycyclic may be, for example, perylene and naphthalene compounds, respectively.

Alternatively, in the embodiment, the deposition steps may be carried out N times in succession for a first selected polycyclic compound, and one or more times in succession for the bifunctional reagent.

In another general embodiment of the method, the surface-reactive groups on the substrate are maleimide groups, the selected compound is a polycyclic compound with z-axis amine groups, such as a diaminocarbozole, and the bifunctional reagent is a bismaleimide compound.

The method is useful for example, in forming organic monolayers in an organic light-emitting diode (OLED), and OLED array, organic field effect transistor (OFET), non-linear optical devices, photoreceptors and solar cells, waveguides, and a supercapacitor.

In another general embodiment, the invention includes a polymer-based layered-structure comprising (i) a substrate, (ii) a first monomolecular layer composed of monomers of a selected aromatic compound, preferably a polycyclic compound, having a defined z axis oriented substantially upright with respect to the plane of the monolayer, e.g., normal to the plane, or within about 0–54° of normal, with the monomers forming the monolayer being covalently attached at one axial end to the substrate, and (ii) a second monomolecular layer composed of monomers of a selected polycyclic aromatic compound having a defined z axis oriented substantially normal to the plane of the monolayer, with the monomers forming the monolayer being covalently attached at one axial end to axial end of molecules forming the first monolayer. Exemplary monolayer compositions are as above.

The compositions find applications, for example, in organic monolayers in an organic light-emitting diode (OLED), an OLED array, organic field effect transistor (OFET), electronic-switch, non-linear optical devices, photoreceptors, waveguides, and supercapacitors.

BRIEF DESCRIPTION OF THE DRAWINGS

In order to understand the invention and to see how it may be carried out in practice, some specific embodiments will now be described, by way of non-limiting examples only, with reference to the accompanying drawings, in which:

FIG. 9 is plot of UV absorption maxima of NTCDI as a function of bilayer numbers with different organic spacings.

FIG. 10A shows the energy shift of the NTCDI—HM superlattice absorption peak, marked by arrow in the insert (10B) graph, as a function of superlattice thickness, where the symbols correspondent to experimental data, and the solid curve is the fit using the model described in the text, and where the 9B insert shows the absorption spectrum of a NTCDI—HM multilayer sample.

DETAILED DESCRIPTION OF THE INVENTION

This invention addresses the need for new approaches to multifunctional organic surface structures by developing concepts, methods, and molecular building blocks with covalent bonding as a unifying theme. Typically large disc-like p-conjugated organic molecules (perylene, naphthalene, and triarylamine derivatives) are covalently attached to the surface. The driving force for face-to-face packing is p-stacking and hydrophobic interactions. Assembling these 2D layered structures from the vapor-phase is assisted by a template layer dictating epitaxial growth.

Employing the method of the invention, organic multiple quantum wells (OMQW) structures and superlattices were assembled. In these quantum confined structures, directional charge injection and charge confinement were achieved and manipulated for uses in specific photo-electronic applications. A novel approach to quantum confined organic light emitting diodes (OLED'S) was demonstrated. Full characterization of the structures, photophysical, electronic, and optically nonlinear properties of the superlattices is an essential aspect of the invention.

A. Reactor and Reactor Conditions

Figure 1:
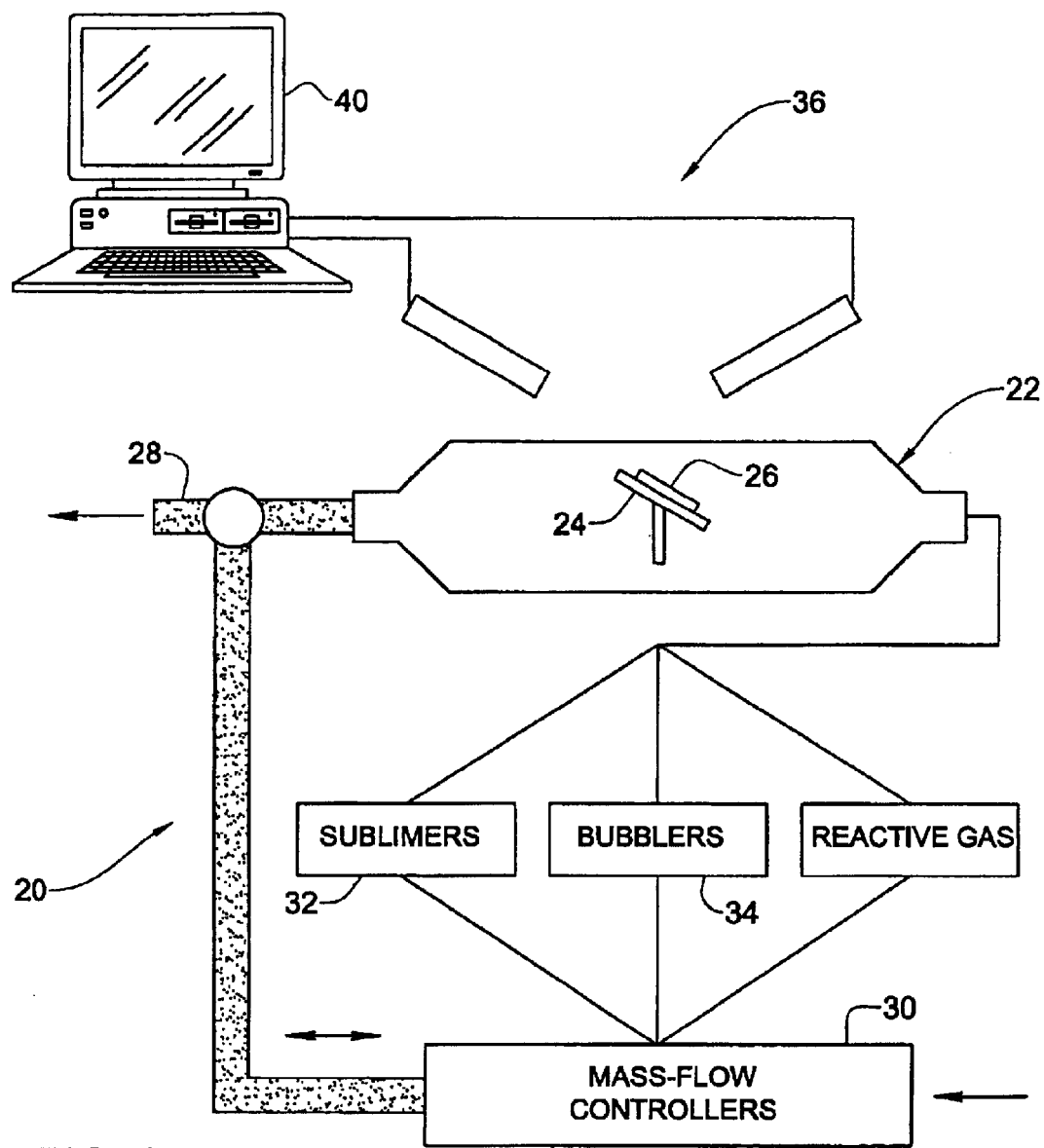
FIG. 1 is a schematic drawing of an MLE reactor useful in practicing the method of the invention.

FIG. 1 shows a reactor 20 for use in practicing the molecular layer epitaxy (MLE) method of the invention. The reactor includes a chamber 22 housing a sample-holder 24 designed to hold and heat to a desired temperature, a sample substrate 26. The reactive molecules to be deposited, in vapor phase are carried through the chamber on a carrier gas, e.g., argon, in a right-to-left direction in the figure, under the influence of a vacuum source 28. A mass-flow controller 30 in the apparatus controls the introduction of reactive gas, at a sublimer 32, where the gas is mixed with argon through a bubbler 34, for introduction into the chamber 22. The deposition of a layer on the substrate is monitored by an in situ spectroscopic ellipsometer, under the control of a unit (not shown), with visual display 40. One exemplary reactor is constructed with commercially available vacuum chambers components, equipped with an M-44 Woollam Co. spectroscopic ellipsometer.

Laminar flow in a low pressure CVD reactor is considered to be a precondition of high-rate growth of textured films in deposition of inorganic semiconducting and superconducting films. Convection effects are particularly important in low pressure CVD, where mass transfer usually controls the deposition rate. We calculate our aspect ratio for horizontal laminar flow MLE-CVD reactor based on methods described out in refs. 14 and 15. In the frame of those methods the following simplifications were made: (i) the film growth rate is slow compared with the gas phase dynamics, so the gas phase may be in pseudo steady-state, i.e. the time derivatives in the momentum, energy and species balance may be set to zero; (ii) longitudinal diffusion of momentum is small in comparison with advection and that pressure variations in the axial direction are large compared to pressure variations in the transverse direction.

The prototype system was based on the following reaction conditions: the reactor walls were heated to avoid molecule condensation on the walls; the CVD was operated in the pulse mode; the chamber base pressure was $10^{-5}$ Torr, operation $1-100 \times 10^{-3}$ Torr; temperature of the sample holder about 130–450° C., e.g., 250° C., temperature of the reactor walls, 100–400° C., e.g., about 325° C.; temperature of the sublimers, 35–300° C., temperature of the bubblers, 3–80° C., time of each pulse, 3–15 minutes, cleaning pulse with argon, about 3 minutes. The final chosen dimensions of reactor were aspect ratio: 1:3, length:height ratio: 1:7. The usual value of linear expansion angle of 7 degrees was accepted to avoid expansion of steady non-uniform gas flow. The susceptor was tilted 6 degrees to decrease the effective cross section of the cell. This increases the gas velocity, thus reducing the boundary layer thickness and increasing the growth rate.

In the MLE invention, carrier-gas assisted organic chemical vacuum deposition (OCVD) at lower pressures ($10^{-2}$ to $10^{-4}$ Torr), is employed. Therefore, an MLE reactor (FIG. 1) was designed and built in order to have a tailorable yet reproducible means of film deposition. This reactor is capable of large-scale production and was also used for device fabrication. However, it should be noted that MLE method is not restricted to laminar flow CVD reactors, and may be carried out with reactors having other configurations, operating in other pressure ranges and mass-flow modes.

B. Template Layer

The method of the invention enables one to form a multilayered structure composed of two or more discrete monomolecular layers. Each monomolecular layer is composed of molecules of a selected aromatic compound having a defined axis, preferably a defined z axis, wherein the said axis is oriented upright with respect to the plane of the monolayer, e.g., normal to the plain or within up to 54° off normal. According to the method of the invention, molecules of a selected polycyclic aromatic compound having a defined z axis with a chemically reactive group at each axial end are deposited on a substrate having surface reactive sites capable of reacting with the chemically reactive group in the selected compound.

Figure 2A:
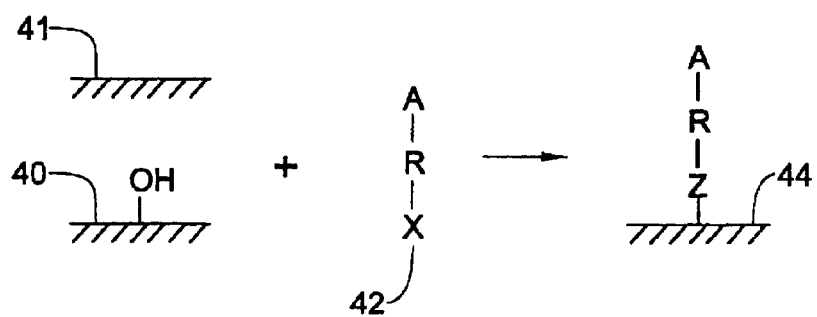
FIG. 2A illustrates various chemical derivatization reactions for forming a surface reactive template layer on oxide (including hydroxyl containing thermally stable polymers) or metal surfaces.

Thus, the method of the invention requires providing a substrate having reactive surface sites capable of reacting with the chemically reactive group in the selected compound. Such a substrate may be provided, for example, by the process described in FIG. 2. Illustrated in FIG. 2 is a reaction between a substrate 40 having an outer hydroxyl layer or a substrate 41 having an outer metal layer, with a coupling agent 42 having a first reactive group (X), which is capable of reacting with the oxide of substrate 40 or with the metal of substrate 41; a spacer (R), which may be, for example, an aliphatic, aromatic, inorganic or metaloorganic moiety; and a second reactive group (A), which is either identical to X or incapable of reacting with the hydroxyl- or metal-containing substrates, but still capable of reacting with the chemically reactive group in the selected compound. The reaction between the substrates 40, 41 and the coupling agent 42 results in the formation of a substrate 44 having surface reactive sites (A), connected to it through the spacer R and a species Z, which is the product of the reaction between the substrate reactive sites and the first reactive group X.

Although FIG. 2 is given in terms of reacting oxides, metals and chlorides, it should be understood that similar reactions may be carried out with other surfaces, where instead of the above there is a hydride, a nitride, a methoxide, etc.

Figure 2B:
FIG. 2B is a table that summarizes some substrates, coupling agents and resulting template layers that may be in the reactions described in FIG. 2A.

FIG. 2B summarizes some substrates, coupling agents and resulting template layers that may be used according to the invention.

C. Molecular Monolayer and Multilayer Formation

Initially, a template layer is prepared as explained in the preceding Section, and illustrated in FIG. 2. For instance, clean hydroxylated metal-oxide surface, such as $SiO_2$, $TiO_2$, $Al_2O_3$, or ITO, is converted to an aminated surface by a solution phase reaction, e.g., with 4-aminopropyltrimethoxysilane. Although in this example the template layer is formed by a solution reaction, it should be noted that template layers in general may also be formed by deposition from the gas phase. After the template layer is deposited, all of the following film growth steps are conducted under MLE conditions.

FIG. 3 illustrates a general scheme for growing an MLE multilayer of alternating monolayers. In step i, the template layer 44 is reacted with a selected polycyclic aromatic compound 46 having a core π and a defined z axis 46' with a chemically reactive group B at each axial end to give a new substrate 48 having a surface-exposed monolayer with exposed reactive groups B. The product of the reaction between the reactive group A of substrate 44 and the reactive group B of the selected polycyclic aromatic compound 46 is designated in the figure as C.

In step ii, a bifunctional reagent 50 having reactive groups A that reacts with said exposed reactive groups B, is reacted with the substrate 48 to produce a coupling layer 53 having exposed reactive groups A with which the reactive groups B of the selected compound 46 forming the next monolayer can react.

Repeating steps i and ii a given number of times, n, results in obtaining a substrate 54, containing a multilayer of n units 55 with exposed reactive groups A.

Figures 3A, 3B:
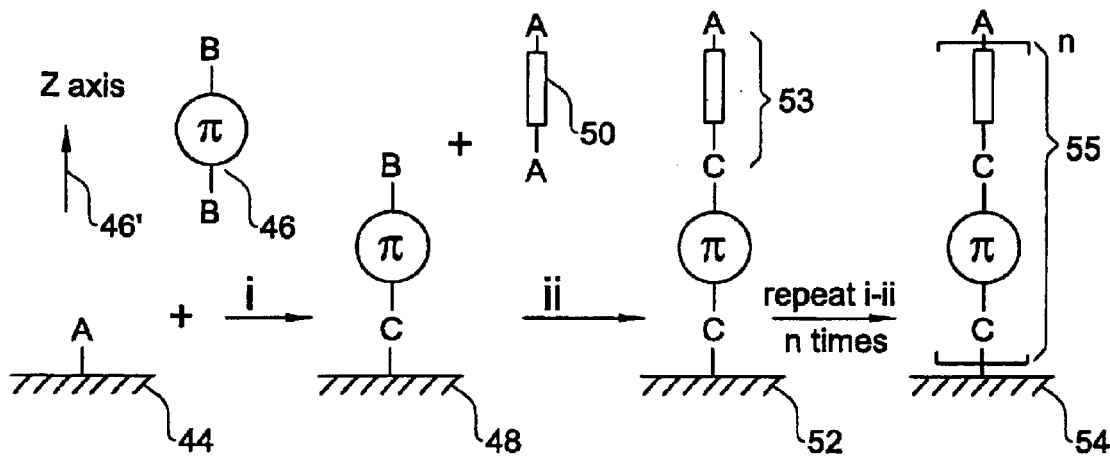
FIG. 3A illustrates multilayer formation by MLE on top of the template layer.
FIG. 3B is a table summarizing some possible meanings of the symbols used in FIG. 3A.

Some possible meanings of the symbols used in FIG. 3 are summarized in FIG. 3B. The table further indicates some of the numerous possibilities to obtain any possible electronic combination, such as insulator-semiconductor, conductor-semiconductor, insulator-conductor, and semiconductor—semiconductor. The role of A and B change from the middle column to the column on its right in order to allow the table to demonstrate the possibility to react compounds according to columns and according to rows in the right hand side of the table.

Figure 4A:
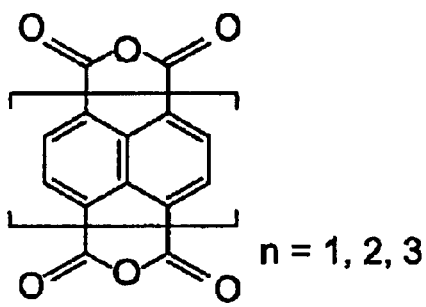
FIGS. 4A–4C illustrate exemplary aromatic monolayer compounds useful in forming organic superlattice structures in accordance with the invention.
Figure 4B:
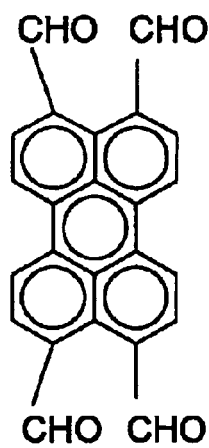
Figure 4C:
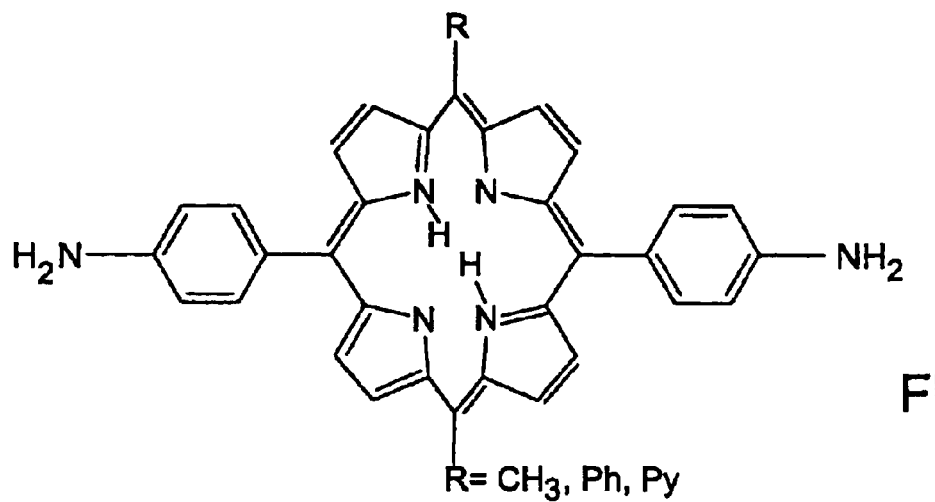
Figure 5A:
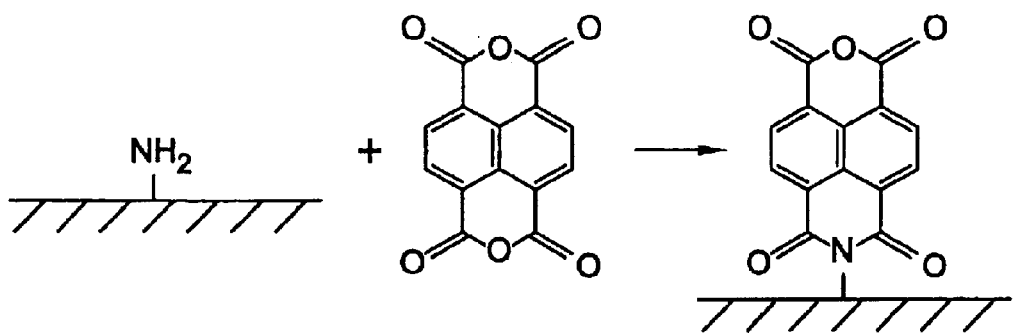
FIGS. 5A–5D illustrate exemplary aromatic monolayer compounds and corresponding bifunctional coupling compounds useful in forming organic superlattice structures in accordance with the invention.

FIGS. 4A–4C illustrate various polycyclic aromatic compounds suitable for use in forming the initial monomolecular layer of aromatic monomers on the template layer. In FIG. 4A, the compound is a naphthalene (n=1), perylene (n=2) or terylene (n=3) tetracarboxylic dianhydride compound, having a z axis that extends through the two ring oxygen groups. Thus, the compound has reactive anhydride groups at axial ends of the molecule. During vapor-phase deposition, one end of the molecule reacts with template layer amine groups to form a surface imide linkage, as illustrated in FIG. 5A.

Figure 5B:
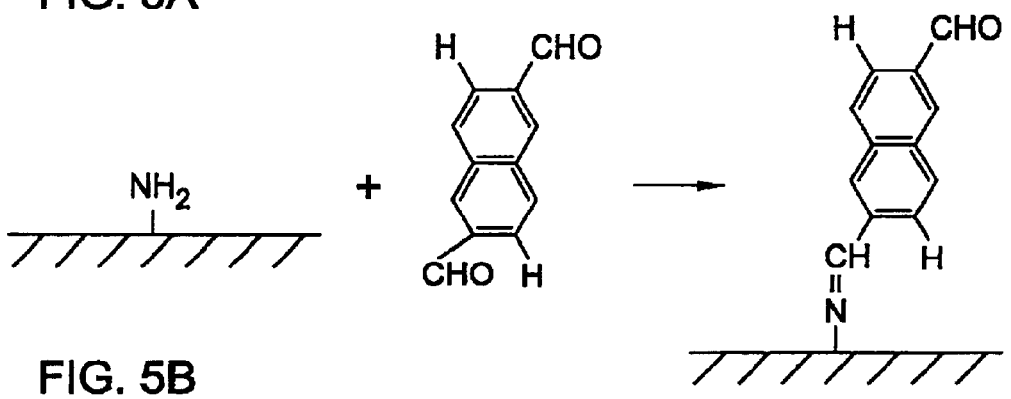

FIG. 4B shows a polycyclic aromatic compound having axial aldehyde groups that can react with a template layer amine groups to form covalent Schiff base linkages between the template and compound, as illustrated in FIG. 5B.

Figure 5C:
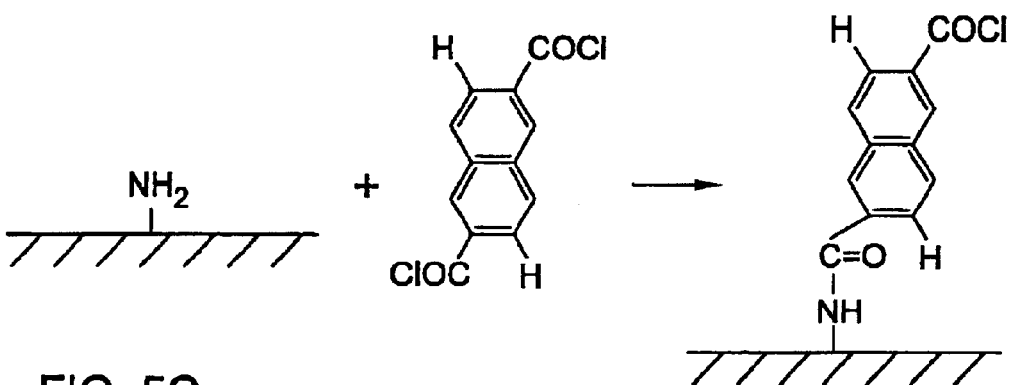
Figure 5D:
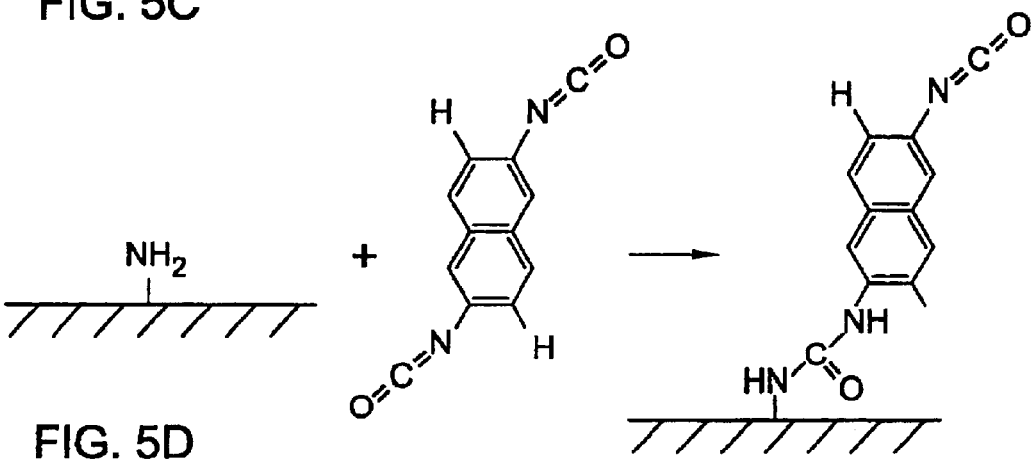

FIGS. 5C and 5D illustrate other polycyclic compounds having axial-end reactive groups, and their reaction with template layer amine groups to form covalent linkages to the template layer exposed amine groups.

Finally, FIG. 4C shows a porphyrin with axial end amine groups, for reaction with, for example, template-layer anhydride, aldehyde, acyl halide, isocyanate, or maleimide groups, for covalent attachment of one template end to the exposed reactive groups in the template layer. Examples of polycyclic compound with axial-end amines, and their reaction with maleimide template groups, will be described below.

E. NTCDA/DAH Superlattice

Figure 6:
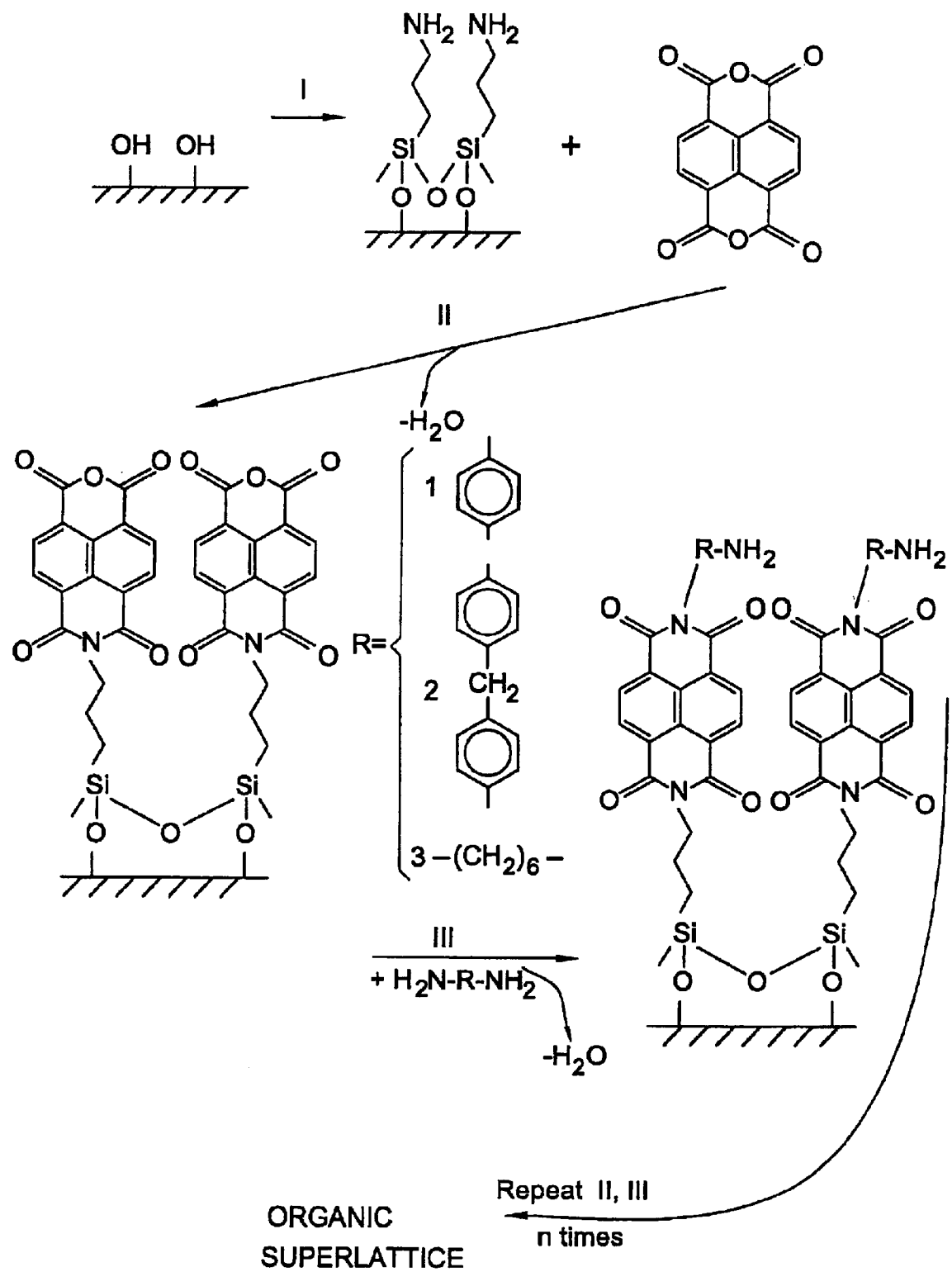
FIG. 6 illustrates steps in forming a perylene/naphthalene superlattice in accordance with the invention.

FIG. 6 illustrates steps in forming a multilayer structure of 3,4;9,10-naphthalene tetracarboxylic-dianhydride (NTCDA), where each monolayer is linked by 1,6 diaminohexane groups (DAH). In the first step (step i, arrow I in FIG. 6, which is described in more details in FIGS. 2 and 3) a template layer with exposed amine groups is formed on a silicon-oxide or metal substrate. In the second step (step ii, arrow II in FIG. 6) this layer is reacted under MLE conditions to form the first monolayer of aromatic compounds on the template layer. During the deposition, vapor-phase molecules react covalently with the template reactive groups, to attach a monolayer of the compound over the template layer, at one axial end of the compound molecules. This axial orientation, coupled with pi-stacking forces, acts to orient the molecules with the z axes substantially upright with respect to the surface of the substrate, e.g., with the molecules' z axes within about 0–54 degrees to normal to the monolayer plane, in a close-packed arrangement. At the same time, the heated (e.g., 250° C.) template surface acts to sublime off non-covalently bound compound, resulting in a close-packed monolayer of the compound, that is, epitaxial deposition of an organic monolayer on the substrate. FIG. 6, also illustrates the possibility to replace DAH by other diamine compounds. Illustrated are 1,4, diamino benzene (DAB) and 4,4'-methylene-dianiline (MDA).

Figure 7:
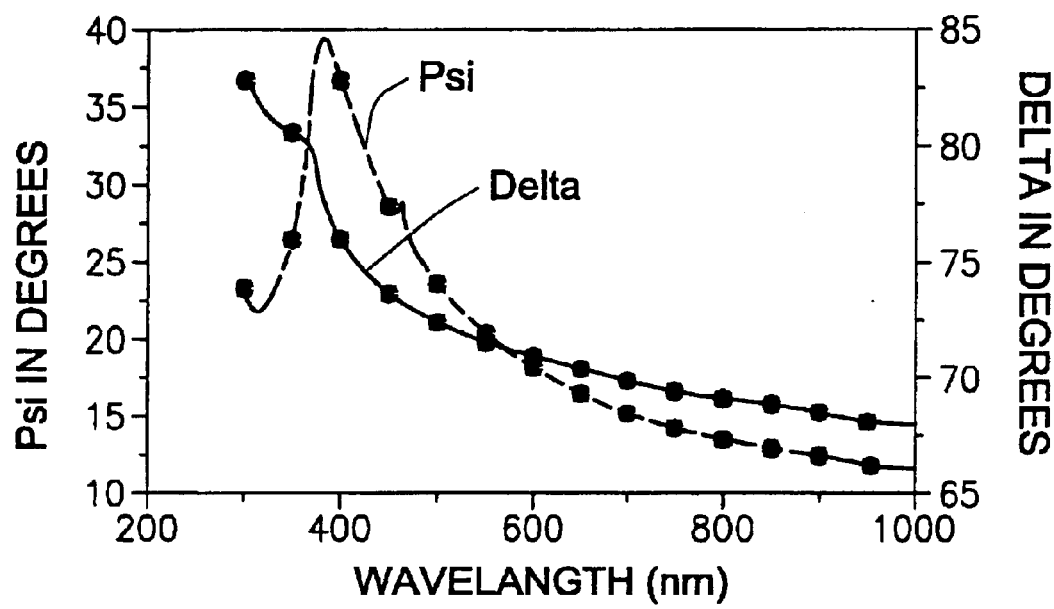
FIG. 7 is a plot of generated and experimental elliposometric data for 9 bilayers of NTCDI—HM formed in accordance with the invention.

Reaction with vaporized aliphatic- or aromatic-diamine (step iii, arrow III in FIG. 6) then regenerates an aminated surface ready for the next deposition (i.e. repetition of another step similar to step ii,). As indicated in FIG. 6, steps ii and iii may be repeated N times to form N stacked monolayers of the core of the selected polycyclic aromatic compound, in this case, naphthalene. FIG. 7 shows measured and fitted ellipsometric data for a superlattice with n=9 (NTCDI—HM)n structure, where n is a number of bi-layers and each bi-layer contains one monolayer of NTCDI and one of HM, oriented in c-axis. There is a good fit between experimental data and the generated model, and this is shown in the graph by the dots that lie exactly on the calculated line. The fit has mean squared error (MSE) fitting parameter less than one. Molecular c-axis interplanar spacings are: 0.96 nm for NTCDI and 0.62 nm for the hexamethylene (HM) spacer. Difference in the interplanar spacing obtained by MBE stacking deposition (0.35 nm for NTCDA) and MLE is the difference between van der Waals stacking and covalently bonded c-axis MLE thin film growth. The structural parameters of the model were confirmed by comparison with XRD data of a model compound N,N-dihexyl-NTCDI reproducing the same superlattice interlayer spacing on molecular level and also with NTCDA crystallographic data. Contact angle was measured after every deposition step. Contact angles were: 15.50° for $SiO_2$/Si and 65°, 92° and 70° after steps i–iii, respectively. Values of contact angle for (NTCDI—HM)n thin films for steps ii–iii were reproducible up to n=9. The growth of the contact angle value corresponds to hydrophobic changes of growing interface.

Figure 8:
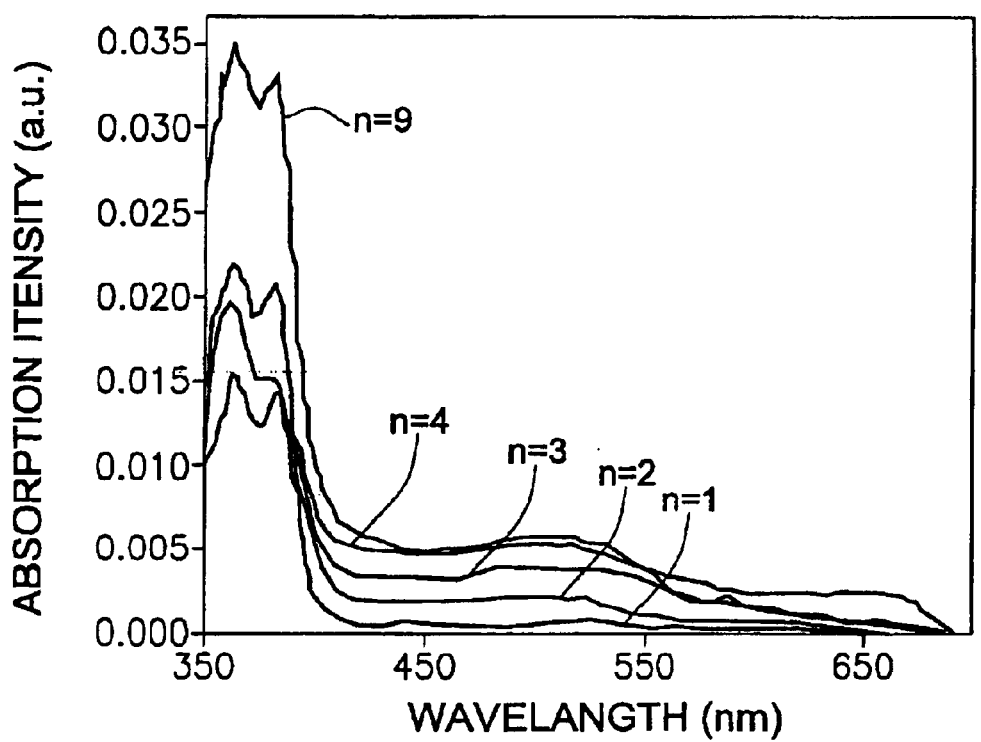
FIG. 8 shows UV-Vis. absorption spectra of different thicknesses of (NTCDI—HM) ultra-thin films.

FIG. 8 shows UV-Vis absorption spectra of (NTCDI—HM)n superlattice as a function of bi-layer number. Optical density of those films at 360 nm, 383 nm and 522 nm shows monotonic growth with increasing numbers of NTCDI—HM bi-layers. We attribute UV peaks at 360 and 383 nm to isolated NTCDI absorption and broad peak around 522 nm to in-plane pi-stacking absorption respectively. The broadening of the visible part of the spectra corresponds to generalization of electrons with different energies capable of passing the bandgap in in-plane direction. However, when n=9, the superlattice field in perpendicular direction is sufficient to influence on pi-conjugated electrons band around 520 nm is clearly observed for films with n=9.

Blueshift of 380 nm UV peak position appeared at decreasing the numbers of deposited bi-layers, which was predicted and observed for organic superlattices is shown in FIG. 9 for different spacers. The UV band at around 380 nm for one bi-layer is shifted to higher wavelength number as superlattice thickness increase. This blueshift in the exiton energy in NTCDI may be due to molecular polarization in the presence of an exciton which extends into the NTCDI-HM in the multilayer structure. Alternatively, the exiton energy shift can be due to the change in exciton binding energy as a result of quantum confinement.

F. Evidence to Quantum Confinement in MLE Multilayers

Evidence of quantum confinement of extended charge transfer states in organic multilayer structures was previously provided by So and Forrest, Haskal et al, and Hong et al. It was observed that the lowest-energy absorption peak, the ground state vibration frequency of exciton fluorescence spectra, and exiton photoluminescence peak shift to higher energies as the layer thickness decreased. In FIG. 9 there is observed a blueshift in the exiton energy of NTCDI, which may be explained by a molecular polarization in the presence of an exciton which extends into the NTCDI-HM in the multilayer structure. Alternatively, the exiton energy shift may be explained by a change in exciton binding energy, which results from quantum confinement.

In order to establish the nature of this blueshift the energy shift of the NTCDI-HM superlattice absorption peak DE as a function of superlattice thickness was calculated. FIG. 10 shows energy shift of the NTCDI—HM superlattice absorption peak, marked by arrow in the insert graph (FIG. 10B), as a function of superlattice thickness. The symbols correspond to experimental data and solid curve is the fit to the model. The observed thickness dependence, proportional to $t^{-5}$, can be explained by confinement of the exiton in a narrow potential well consisting of a NTCDI layer confined between two HM layers.

G. Mixed Layer Structures

To form monolayers of alternating selected compound, steps ii and iii in FIG. 6 are repeated, except with a different compound at each repetition, e.g., 3,4;7,8-perylene tetracarboxylic dianhydride, PTCDA and NTCDA. Repeating steps ii–iii several times lead to the formation of polyimide-based superlattices with alternating chromophores. In a similar manner it is possible to form structures of any number of mutually different compounds repeating in any desired order.

It should be noted that repeating step iii with a bifunctional reagent is not a necessity. It is also possible to form monolayers of alternating selected compounds such as PTCDA and NTCDI without a spacer inbetween them. In the present example, this may be done if the reactive group on the polycyclic aromatic molecules (step iii) is hydrazine.

Structures of alternating chromophore arrays having different electron affinities yield organic quantum confined structures. PTCDI can be regarded as an electron sink (a deep potential well) where trapped electrons in the form of radical-anions are stabilized by the carbonyls on the periphery of the large perylene pi-system. Electron barriers in this case are chromophores with lower electron affinity, e.g., NTCDA, or molecular insulators such as linear alkyl chains. Controlling the heterostructure well 'depth' or barrier 'height, ' is accomplished by varying the number of times steps ii–iii are repeated with well-molecules and how many times with barrier-molecules. Furthermore, these quantum confined layers (each composed of several monolayers) can be separated one from each other by different alkane chain length ([CH2]n, n=2–20; in steps iii). This provides a powerful tool for formation of quantum-confined nanostructures exhibiting anisotropic electron transfer and tunneling.

PTCDA and NTCDA were selected as the first model system for this study because this pair was used in the first successful demonstration of an OMBE derived OMQW. The results obtained, demonstrate the superior performance of the covalent MLE approach is superior to the van der Waals quasi-epitaxy approach, known in the literature both in its synthetic flexibility and in enabling the user to control the superlattice on the molecular level.

To illustrate the many possibilities of synthesizing multilayered structures, we describe in FIG. 12 ladder, metal organic and rigid-rod semiconducting polymers that are inaccessible via solution chemistry.

Figure 12A:
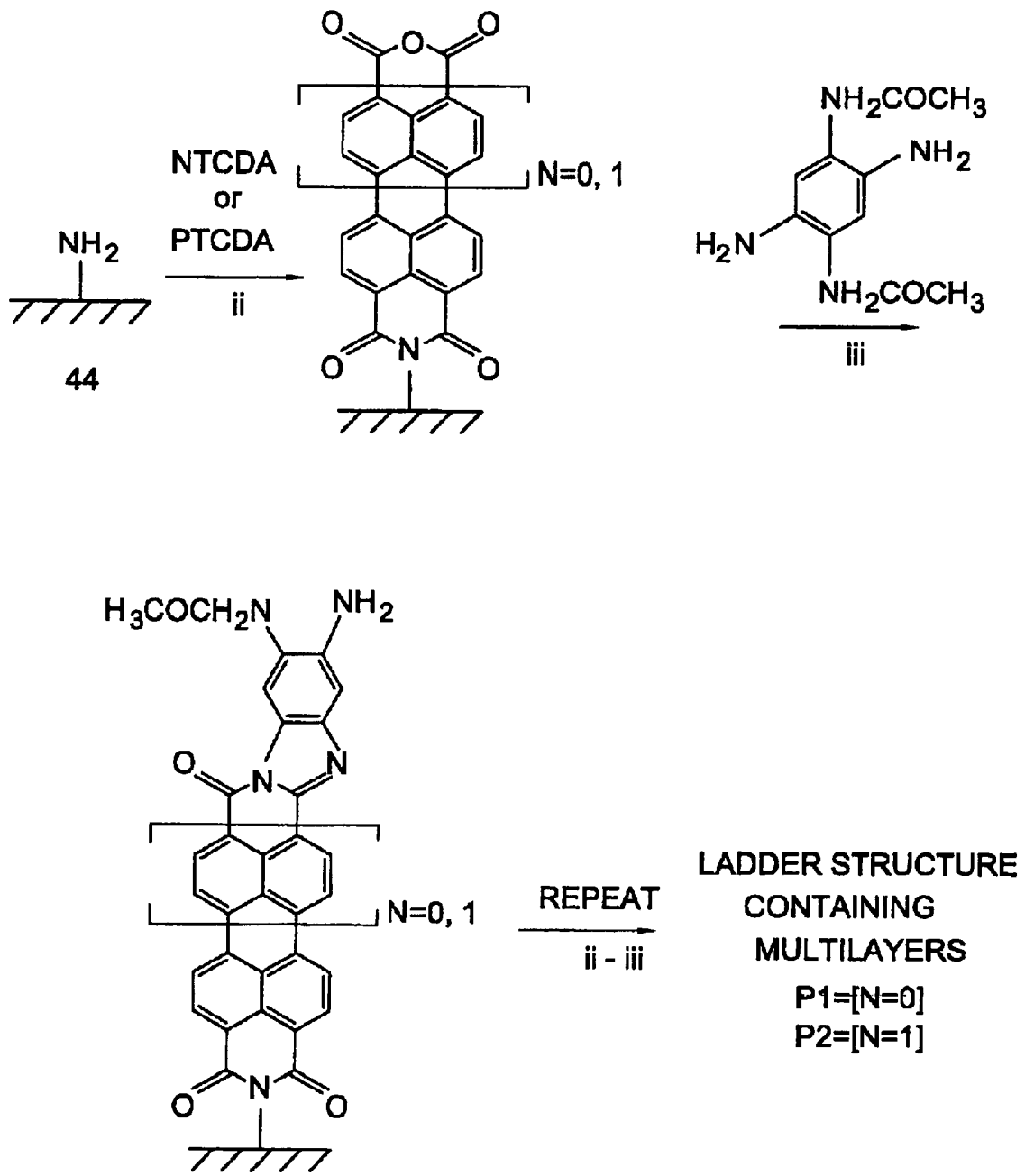
FIGS. 12A–12C illustrate various multi-layered structures that can be generated in accordance with the method of the invention.

FIG. 12A describes a method for obtaining a ladder naphthalene derived superlattice, hereinafter P1 (n=0) and perylene derived superlattice P2 (n=1). Such poly (isoindoloquinazolinedione)s, can be synthesized by vaporizing step-by-step, as described in the figure, NTCDA or PTCDA with 1,4-diamino-2,5-diamidobenzene. The final superlattices afford electronically double stranded conjugated skeletons combined with extremely stable ladder structure.

Figure 12B:
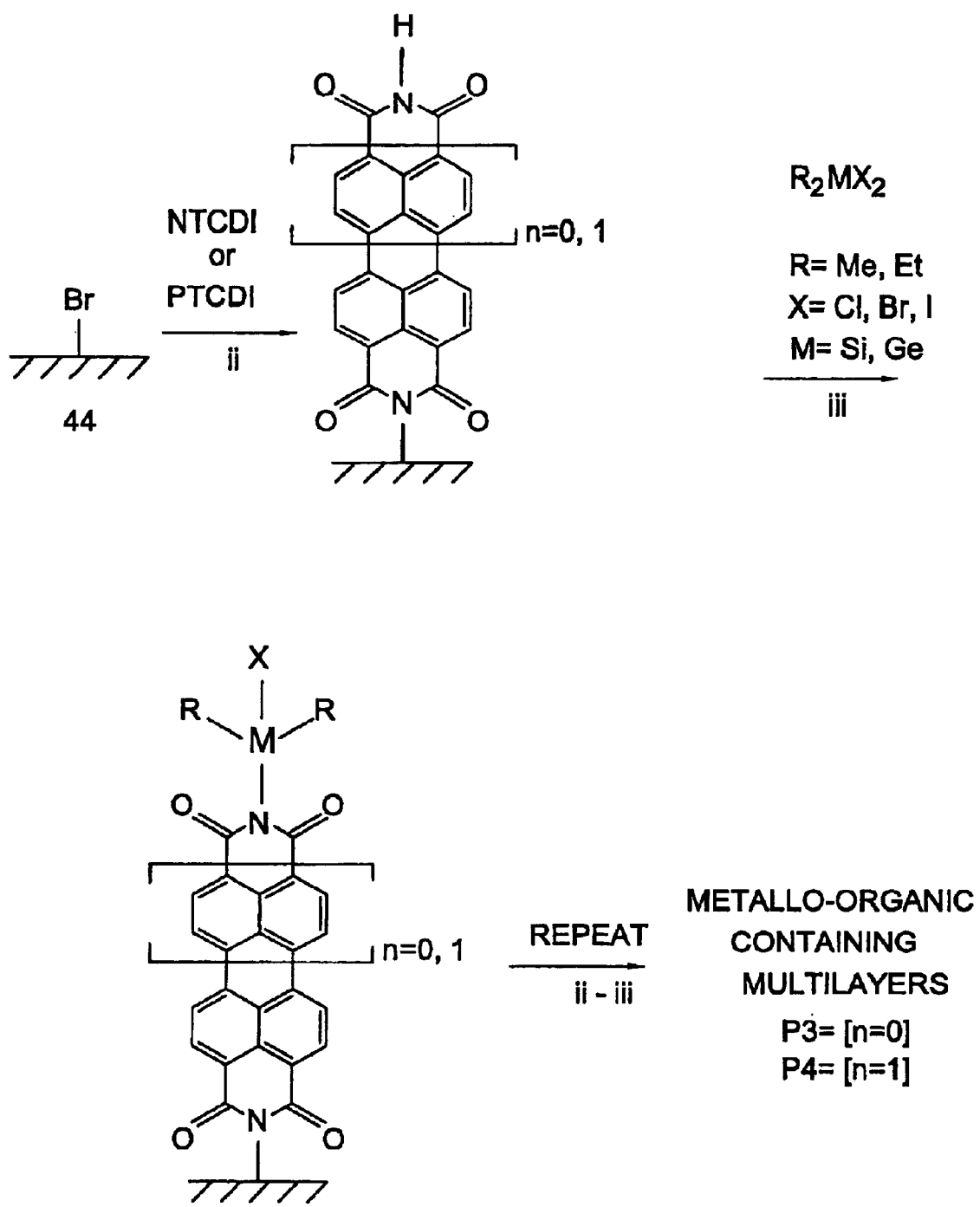

FIG. 12B describes obtaining organometallic polymers, containing silicon or germanium, such as naphthalene-derived P3 (x=0) and perylene-derived P4 (x=1) by depositing either monomer on halogenated surfaces. After NTCDI or PTCDI is adsorbed on the surface, $R_2MX_2$ is sublimed. Some non-limiting examples of chemical species that may be represented by R, M, and X are listed in FIG. 12B.

This class of polymetalloarylenes is unique due to the bridging mode of two luminophores directly by one metal center.

Figure 12C:
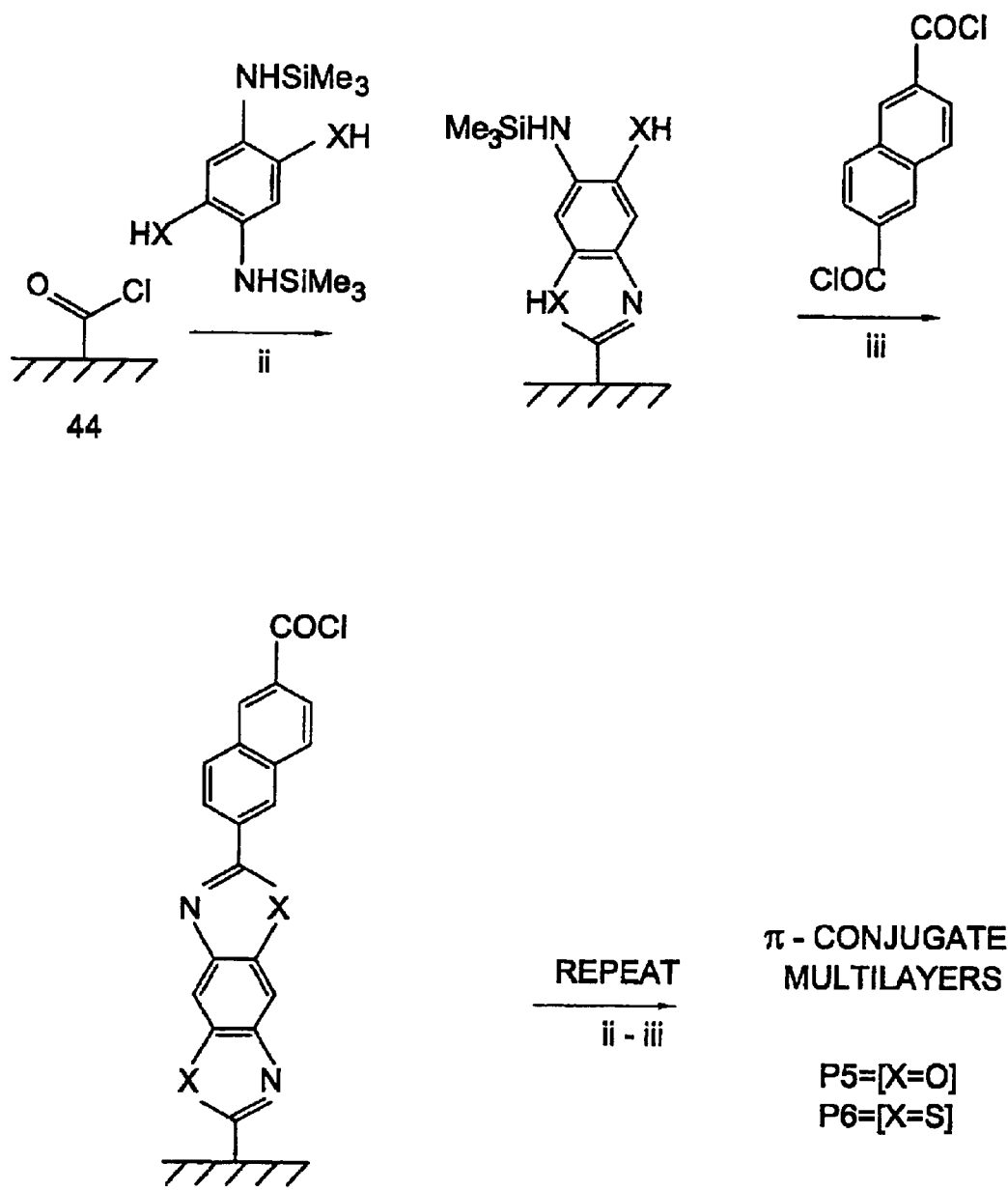

FIG. 12C describes rigid-rod polymers, poly (2,6-naphthalene-benzoxazole) (P5, x=O) and poly(2,6-naphthalene-benzthiazole) (P6, x=S), which may be prepared by subliming the corresponding precursors onto acyl chloride functionalized surface.

H. Carbazole Based Superlattices

Figure 11:
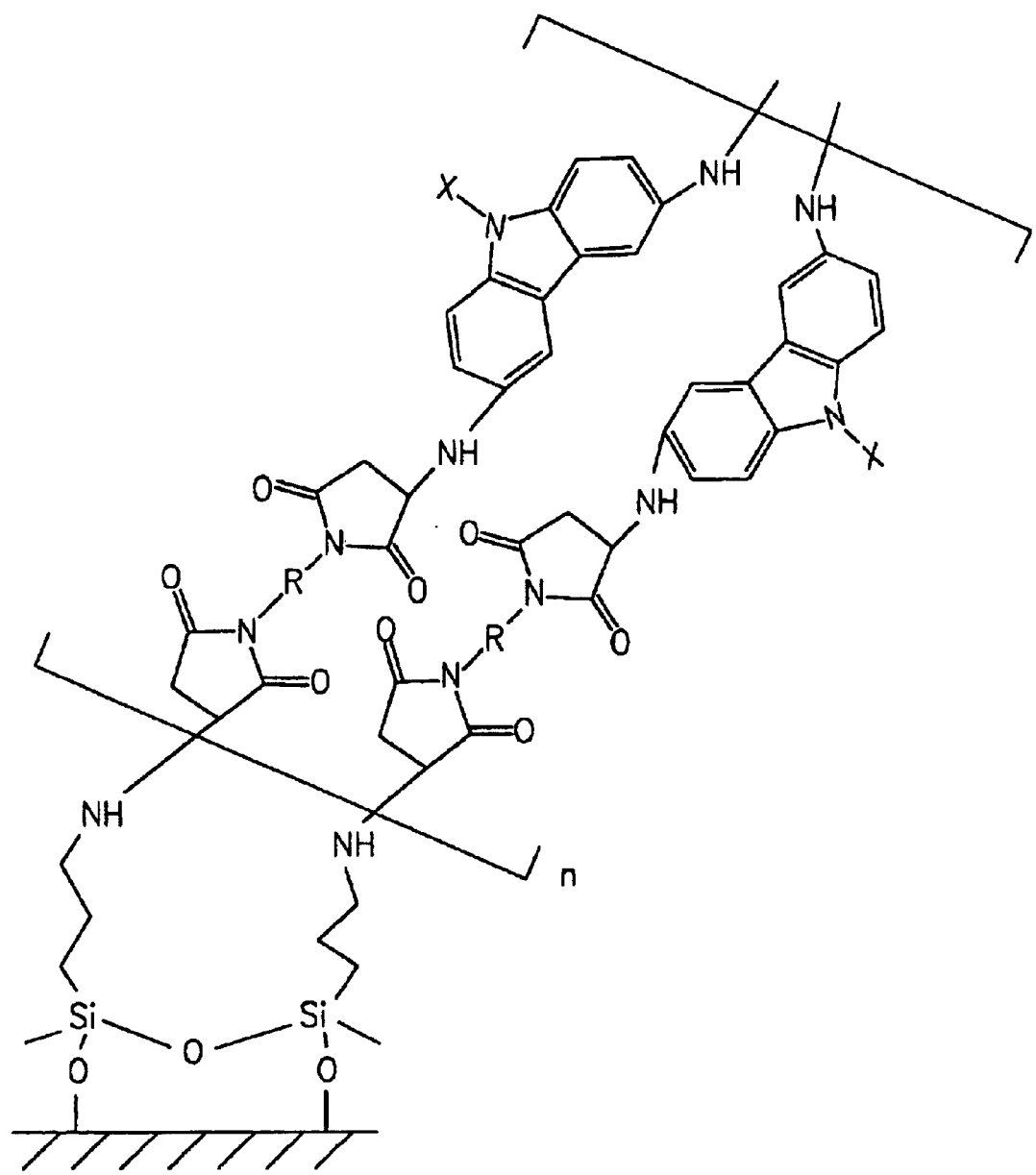
FIG. 11 illustrates a scheme for carbozole, bismaleimide multilayers, in accordance with the invention.

Substituted triarylamines function as an excellent hole transport material for organic LED. Poly(N-vinylcarbazole) exhibited, in addition to its ability of hole transporting, an advantageous properties as a blue-light emitter in organic LED. Another example of an MLE system is a carbazole-based superlattice, based on molecular building blocks with hole transport ability. Utilizing the same synthetic strategy presented for FIG. 6, structures such as in FIG. 11 are synthesized. Vaporization of alkyl- or aryl-bismaleimide onto propyl-amine containing template layer results in the Michael addition product. This step exposes maleimide functionality ready to react with different diamino-carbazole derivatives.

After the carbazole unit is introduced an amine functionality is exposed out of the surface allowing repetition of the process toward multilayered structures. The various carbazole N-substituent (x in FIG. 11) are introduced at divergent layers to form a hole-affinity gradient in the multilayered structure. Improvement of the electron donating ability of the substituents (in this case: going from hydrogen to phenyl to mesityl substituent) increases the hole affinity of the molecule.

J. Applications: OLED

Figure 17A:
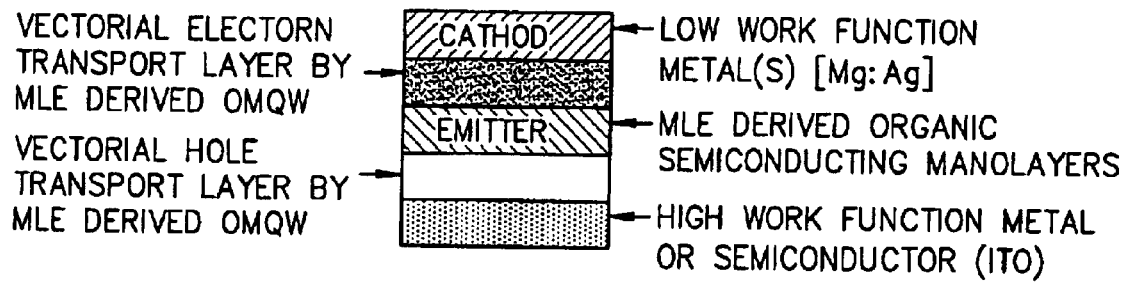
FIG. 17A shows the layers in an optical light-emitting diode (OLED) constructed in accordance with the invention.
Figure 17B:
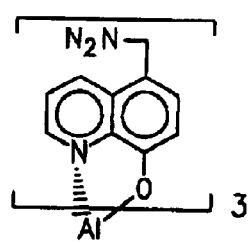
FIG. 17B shows a scheme for attaching amino methyl functionalized aluminum quinolate (Alq) to MLE-based multilayered structure, in the OLED of FIG. 17A.

Conjugated polymers or molecular stacks are organic semiconductors by virtue of the delocalization of the pi molecular orbitals along the polymer chain or in the stacking direction. Such materials frequently exhibit electroluminescence (EL) when incorporated into a device. In a light-emitting diode (LED) device, excitation is caused by the injection of an electron into the conduction band (LUMO) and a hole into the valence band (HOMO) which recombine with emission of visible light. An optimal LED device (FIG. 17A) should exhibit efficient charge injection (electrons and holes) at the metal/organic-layer interface, good charge transport, and efficient radiative charge-recombination. Exemplary materials are: an upper contact cathode made of aluminum, mg:ag alloy, and the like; NTCDI as the electron transport layer; PTCDI as the emitter, triarylamine, diaminocarbazole, or diphenylamine as the hole transport layer; and indium-tin-oxide as the high work function semiconductor. FIG. 17B illustrates a triamine substituted Alq that may serve as the emission layer or the electron injection layer in an OLED grown by MLE.

All of the layers are assembled using MLE in a covalently bonded epitaxial z-oriented structure. The EL in the NTCDI structure is thickness/voltage tunable, and using different thicknesses of NTCDI, different color luminescence, e.g., red, yellow, and green, can be achieved.

More generally, a unidirectional charge injection is obtained in a multilayered structure by assembling an energy-gap gradient of tailored chromophores with hole or electron affinity. Improvement of electron injection is achieved simply by assembling NTCDA/PTCDA beneath the cathode. If needed, fine tuning may be achieved by superlattice construction (semiconductor/insulator) with the thickness of the NTCDA layers increasing (energy-gap decreases) toward the emitter. Additionally a second PTCDA superlattice with a lower energy-gap gradient can be introduced to 'smooth' the electron injection energy levels from the metal electrode toward the emitter. The same concept can be applied for improvement of hole injection utilizing triarylamine multilayer scheme where tunability of the hole affinity is feasible. Multilayers containing different N-substituted carbazoles at each layer may be used to form an energy-level gradient from the anode toward the emitter and thus may enhance hole injection. Both processes should lower the operating bias voltage of a device and therefore increase its stability. Better emitter layers and EL quantum efficiencies are obtained from OMQW due to confinement of charges into the well. This will enhance the probability of radiative charge recombination. Moreover, tunability of the emitted light wavelength is achieved by manipulating the well thicknesses. Additionally, heterojunctions between two emitting-layers, such as OMQW and semiconducting polymers, will allow control over the emitted light through the different bias voltage threshold of the different structures.

Finally, enhancement of EL quantum efficiency due to exciplex formation has recently been observed in a bi-layer emitting configuration composed of donor-type emitters and acceptor-type emitters. The exciplex is, of course, formed at the interface. Thus, increasing the number of interfaces per unit volume is required for such a scheme. The proposed synthetic methods for obtaining organic superlattices provide a most efficient manner to obtain structures with enlarged number of interfaces. These donor/acceptor multilayer-structures (e.g., carbazole/PTCDA bilayers) serve as an avenue for exploring excitonic interfacial states and their applicability in light-emitting device-prototypes.

Figure 13A:
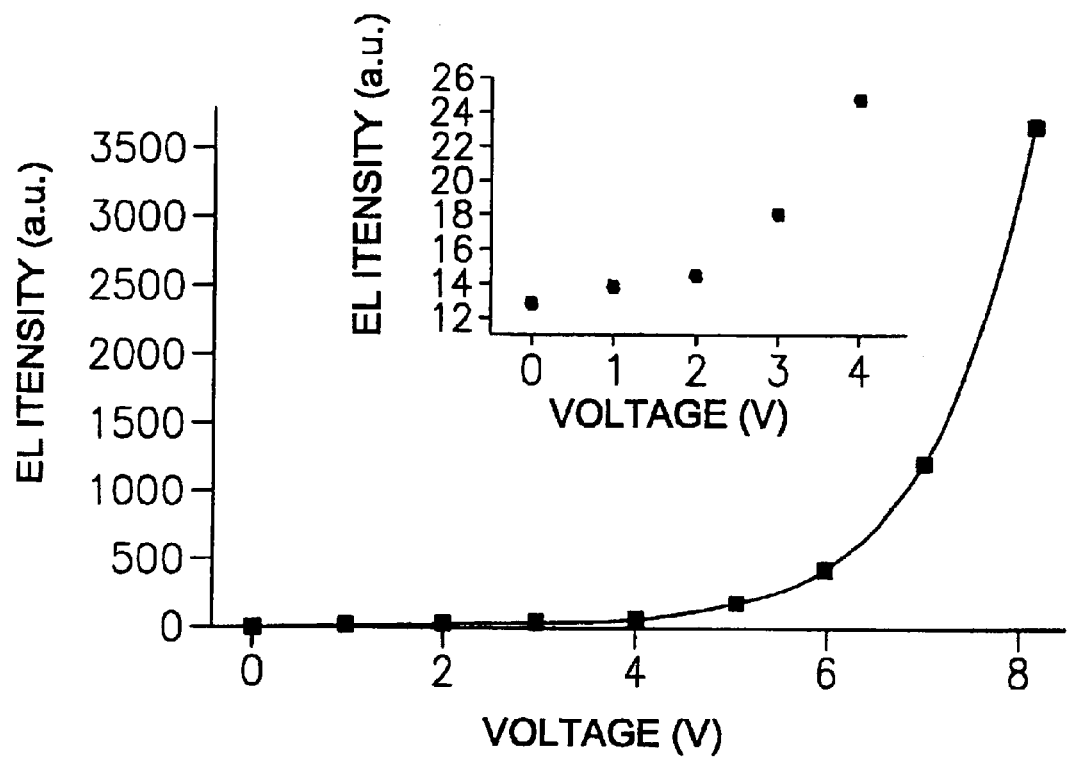
FIGS. 13A and 13B are plots of voltage-dependent EL (13A) and current (13B for naphthalene-based superlattice device, wherein the insert (13C) shows the EL-voltage dependence in a low DC field.
Figure 13B:
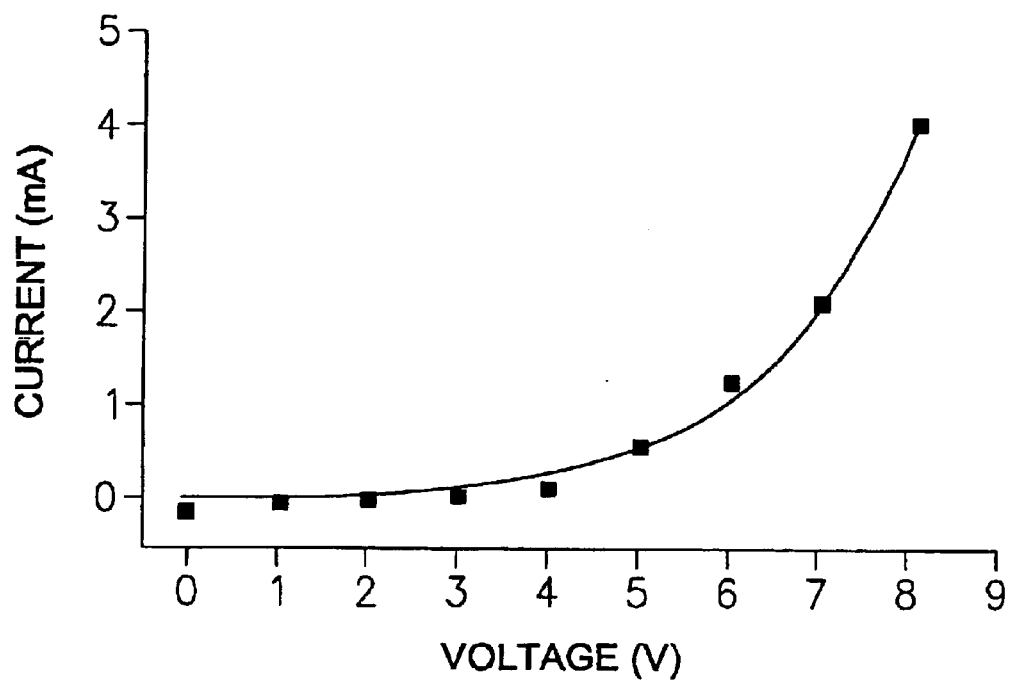

The improved in-plane packing, via pi-stacking, was employed to build an organic light-emitting diode (OLED) having a thickness of a few nanometers. Initial studies on electroluminescence (EL) of NTCDI—HM and NTCDI-MDA superlattices indicated promising properties. FIGS. 13A and 13B demonstrate EL-voltage and I-V curves of resulting LEDs, with threshold voltage about 0.5 Volt. The voltage-current curve of organic MLE thin films exhibit an archetypal semiconductor character. However, this device (NTCDI-MDP)$_{n=3}$ gives an extremely low threshold voltage for emission as well as a very low thickness of organic thin film exhibiting EL phenomena.

Figure 15:
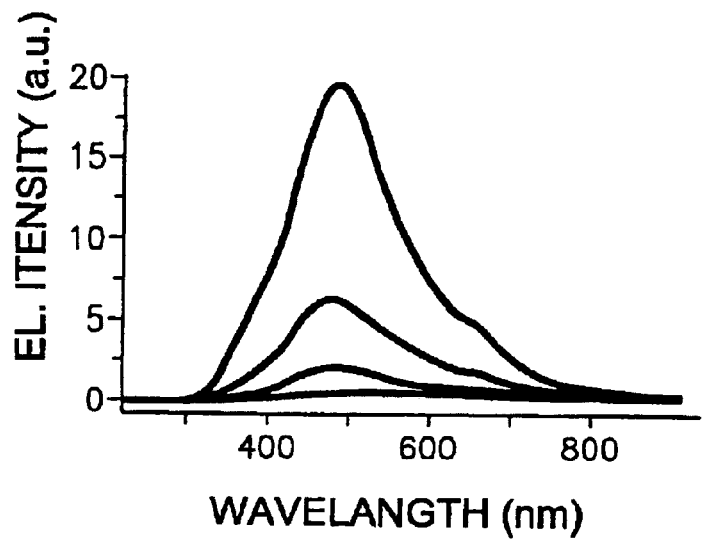
FIG. 15 is a plot of electroluminescence (EL) for a 2-layer NTCDI-MDA film at 5, 6, 7, and 8 volts.

EL spectra of 2-bilayers NTCDI-MDP film at different voltage are shown in FIG. 15, for 5, 6, 7, and 8 volts, showing intensities of 0.5, 2, 6 and 20 a.u., respectively. An unusual EL shown in FIG. 16 was discovered in the NTCDI—HM thin films, at U=0 V.

Figure 14:
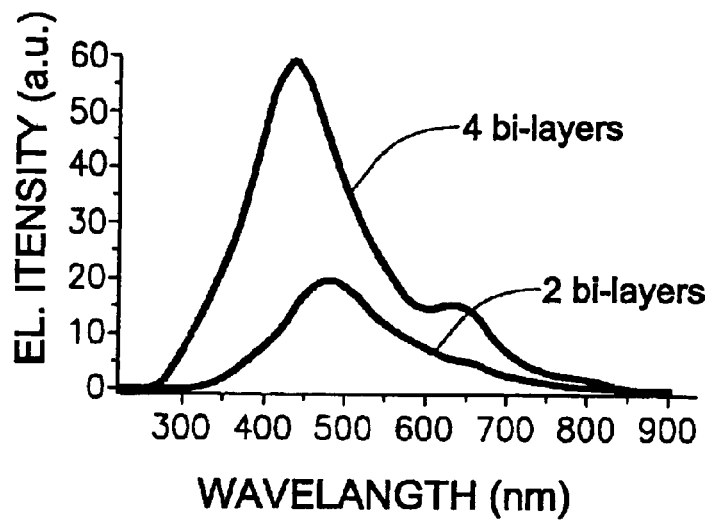
FIG. 14 is a plot of electroluminescence (EL) for 2 and 4 layers of a naphthalene-based OLED constructed in accordance with the invention.
Figure 16:
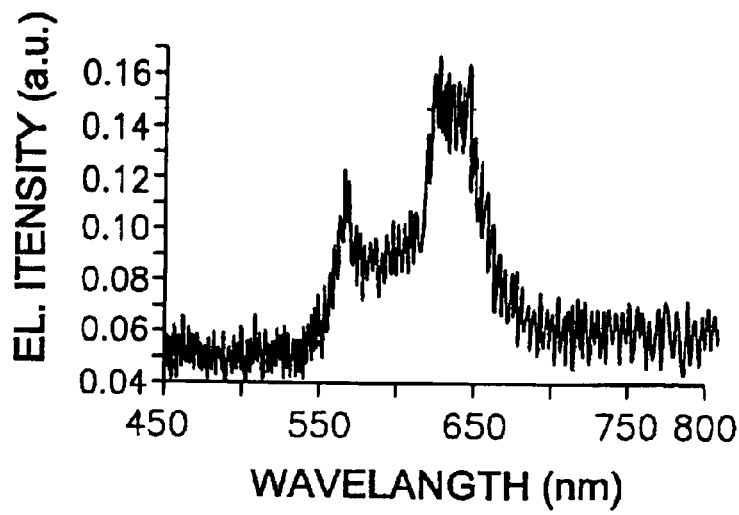
FIG. 16 is a plot of electroluminescence (EL) for a naphthalene-based superlattice at $V_{inp}=0V$.

It is noted that the EL bands in FIG. 16 are narrow and sharp, illustrating the potential applications of such a films as laser cuvettes. Another quantum confinement effect can be observed in the EL-thickness dependence of 2 and 4 bi-layers of MLE naphthalene-based LED, shown in FIG. 14. EL maxima around 480 nm for 2 bi-layers of NTCDI-MDP is shifted almost by 50 nm at 4 bi-layers. This thickness dependent EL shift is observed for the first time in the organic superlattices and opens possibilities to tunable emission of LEDs obtained by MLE-derived methods.

K. Applications: Non-Linear Optical Devices

Materials with large third-order optical nonlinearities are potentially useful for the fabrication of ultrafast (sub-picosecond) optical switches. In particular, for telecommunication applications, materials with high susceptibility, $_x$(chi)$^{(3)} \geq 10^{-7}$ esu in the near IR region ($\lambda$<1 mm) are desired. However, very few materials have sufficiently high $_x{}^{(3)}$. The molecular origins of high $_x{}^{(3)}$ materials are poorly understood, although increasing the pi-conjugation length and lowering the HOMO-LUMO energy-gap both appear to be important.

With the present invention, new mechanisms for $_x{}^{(3)}$ enhancement can be developed. The concept of electron confinement in diminished dimensions that translates to high energy excitonic and surface states (demonstrated in inorganic-MQW and predicted theoretically organic-MQW) can be exploited to enhance the $_x{}^{(3)}$ response. The proposed quantized structures, OMQW, obtained via MLE will allow tailoring "2D" structures having a third dimension in the range of 0.5 to 10 nm. Larger nanostructures, composed of ladder or rigid-rod conjugated polymers, ranging from 10 to 500 nm can be obtained by the MLE technique. Thus, the method is expected to open new routes to $_x{}^{(3)}$ enhancement in organic semiconducting nanostructures.

Figure 18:
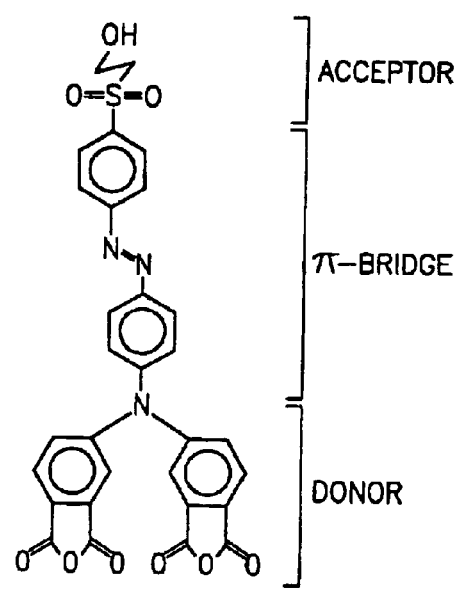
FIG. 18 shows donor, p-bridge, and acceptor layers in a non-linear optic device, in accordance with the invention.
Figure 19:
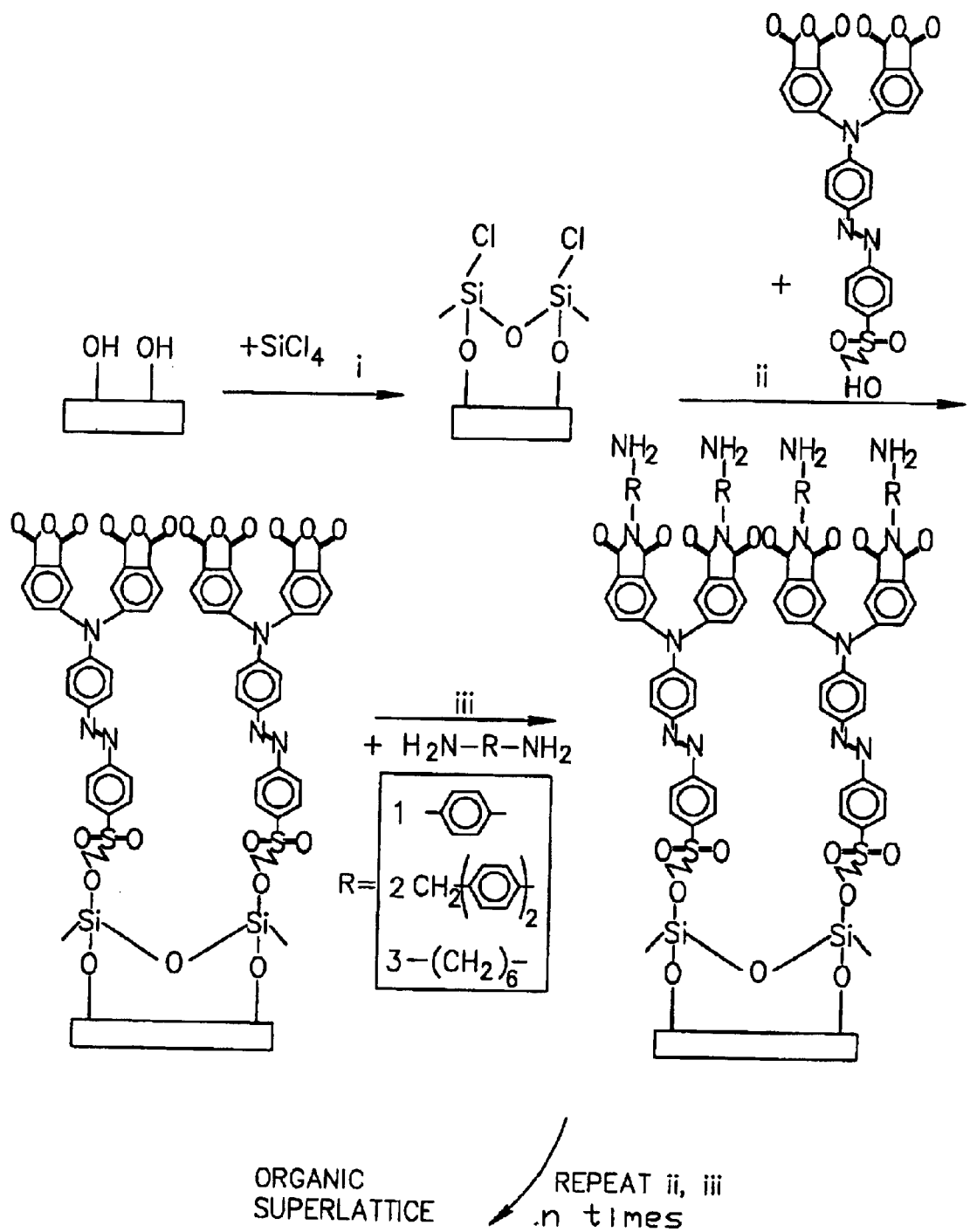
FIG. 19 illustrates a scheme for producing non-linear optic devices, in accordance with the invention.

FIG. 18 shows an example of a subunit for second harmonic generation (SHG), $_x{}^2$ applications. Shown here is a sample of a subunit with donor/pi-bridge/acceptor groups. The synthetic route to this structure is illustrated in FIG. 19.

L. Other Applications

Among a variety of applications for the present method and structures are the following:

An organic waveguide constructed in accordance with the invention is constructed, for example, from the vertical structure: substrate, phenyl, naphthalene, perylene. An organometallic waveguide would contain alternating layers of organometallic layers.

The NTCDI multilayered structure above, with either aliphatic or aromatic spacer moieties, showed a strong supercapacitor effect, in the form of EL after DC power was switched off.

Other applications include: organic LED arrays, switching transistors, electrooptical devices, organic thin-film elements, quantum dot and well structures, field effect transistors —FETs, metal-nitride based semiconductors, and photoreceptors.

REFERENCES

AGRANOVICH et al, "Fermi resonance interface modes in organic multilayer structures", *Chem Phys Lett* 210(4,5, 6): 458–462 (1993)

ANDERSON et al, "Synthesis and Third-Order Nonlinear Optical Properties of a Conjugated Porphyrin Polymer", *Angew Chem Int Ed Eng* 33(6): 655–657 (1994)

BIRD et al, "Velocity Distributions in Laminar Flow", in *Transport Phenomena* Wiley, New York, N.Y., Chapter 2, pp. 34–70 (1960)

BRAUN et al, "Visible light emission from semiconducting polymer diodes", *Appl Phys Lett* 58:1982–1984 (1991)

BRAUN et al, "Electroluminescence and electrical transport in poly(3-octylthiophene)", *J Appl Phys* 72(2): 564–568 (1992)

BURN et al, "Chemical tuning of electroluminescent copolymers to improve emission efficiencies and allow patterning", *Nature* 356:47–49 (1992)

BURROUGHES et al "Light-emitting diodes based on conjugated polymers", *Nature* 347:539—(1990)

CHEMLA et al, "Room Temperature Excitonic Nonlinear Absorption and Refraction in GaAs/AlGaAs Multiple Quantum Well Structures", *IEEE J Quantum Electron* QE-20:265–275 (1984)

DONOVAN et al, "Determination of anisotropic electron transport properties of two Langmuir-Blodgett organic multiple quantum wells", *Thin Solid Films* 244:110–113(1993)

DONOVAN et al, "Determination of the parallel and perpendicular intermolecular tunneling rates in two Langmuir-Blodgett quantum well systems" *Thin Solid Films* 232:923–927 (1994)

FORREST et al, "Ultrahigh-vacuum quasiepitaxial growth of model van der Waals thin films. II. Experimental", *Phys Rev B* 49(16): 11309–111321 (1994)

GREENHAM et al, "Efficient light-emitting diodes based on polymers with high electron affinities", *Nature* 365:628–630 (1993)

HASKAL et al, "Finite size effects observed in the fluorescence of ultrathin crystalline organic films grown by organic molecular beam deposition", *Chem Phys Lett* 219:325–330 (1994)

HASKAL et al, "Excitons and exciton confinement in crystalline organic thin films grown by organic molecular-beam deposition", *Phys Rev B* 51:4449–4462 (1995)

HIRAMOTO et al, "Directed beam emission from film edge in organic electroluminescent diode", *Appl Phys Lett* 62(7): 666–668 (1993)

HONG et al, "Possible evidence for quantum-size effects in self-assembled ultrathin films containing conjugated copolymers", *Appl Phys* 79(6): 3082–3088 (1996)

JENEKHE et al, "Excimers and Exciplexes of Conjugated Polymers", *Science* 265:765–768 (1994)

KIDO et al, "Bright blue electroluminescence from poly (N-vinylcarbazole)", *Appl Phys Lett* 63(19): 2627–2629 (1993)

KIDO et al, " ", *Appl Phys Lett* 64:815- (1994)

KUBONO et al, "Polymer Thin Films Prepared by vapor Deposition", *Prog Polym Sci* 19:389–438 (1994)

LAM et al, "Optical Nonlinearities in Crystalline Organic Multiple Quantum Wells", *Phys Rev Lett* 60(12): 1614–1617 (1991)

LI et al, "Chromophoric Sell-Assembled Multilayers. Organic Superlattice Approaches to Thin-Film Nonlinear Optical Materials", *J Am Chem Soc* 112:7389–7390 (1990)

MARUO et al, "Surface characterization of fluorinated polyimde films grown by vapor deposition polymerization, *J Vac Soc Technol A* 11(5): 2590–2596 (1993)

NAIWA HS, "Organic Materials for Third-Order Nonlinear Optics", *Adv Mater* 5(5): 341–358 (1993)

OHMORI et al, "Observation of spectral narrowing and emission energy shift in organic electroluminescent diode utilizing 8-hydroxyquinoline aluminum/aromatic diamine multilayer structure", *Appl Phys Lett* 63(14): 1871–1873 (1993)

OSAHENI et al, "Efficient Blue Luminescence of a Conjugated Polymer Exciplex", *Macromolecules* 27:739–742 (1994)

PESSA et al, "Characterization of surface exchange reactions used to grow compound films", *Appl Phys Lett* 38(3): 131–132 (1981)

SHIROTA et al, "Multilayered organic electroluminescent device using a novel starburst molecule, 4,4', 4"-tris(3-methylphenylphenylamino)triphenylamine, as a hole transport material", *Appl Phys Lett* 65(7): 807–809 (1994)

SO et al, "Quasi-epitaxial growth of organic multiple quantum well structures by organic molecular beam deposition", *App Phys Lett* 56(7): 674–676 (1990)

SO et al, "Growth and Characterization of organic Semiconductor Heterojunctions and Multiple Quantum Wells", *SPIE* 1285:95- (1990)

SO et al, "Evidence for Exciton Confinement in Crystalline Organic Multiple Quantum Wells", *Phys Rev Lett* 66(20): 2649–2652 (1991)

TAKAHASHI et al, "Preparation of Ultrathin Films of Aromatic Polyamides and Aromatic Poly(amide-imides) by Vapor Deposition Polymerization" *Macromolecules* 24:3543–3546 (1991)

TANAKA et al, "Doping effect on organic semiconductive thin film by plasma polymerization of 3,4,9,,10-perylenetetracarboxyic dianhydride", *Synthetic Metals* 65:81–84 (1994)

TATSUURA et al, "Electro-optic polymer waveguide fabricated using electric-field-assisted chemical vapor deposition", *Appl Phys Lett* 60(14): 1661–1663 (1992).

ULMAN A, "Formation and Structure of Self-Assembled Monolayers", *Chem Rev* 96:1533–1554 (1996)

WANG et al, "Dependence on Piezoelectric and Pyroelectric Activities of Aromatic Polyurea Thin Films on Monomer Composition Ratio", *Jap J Appl Phys* 32:2768–2773 (1993)

YITZCHAIK S,"Chromophoric Self-Assembled NLO Multilayer Materials. Real Time Observation of Monolayer Growth and Microstructural Evolution by in Situ Second Harmonic Generation Techniques", *J Phys Chem* 97:6958–6960 (1993)

YOSHIMURA et al, "Polymer films formed with monolayer growth steps by molecular layer deposition", *Appl Phys Lett* 59(4): 482–484 (1991)

YOSHIMURA et al, "Quantum wire and dot formation by chemical vapor deposition and molecular layer deposition of one-dimensional conjugated polymer", *Appl Phys Lett* 60:268–270 (1992)

ZAKHIDOV et al, "Polarization double barriers at the interfaces in organic multilayered structures and superlattices", *Synthetic Metals* 64:155–165 (1994)

What is claimed is:

1. A multi-layered structure comprising
   a substrate,
   formed on the metallic substrate, a first monomolecular layer composed of monomers of a first selected polycyclic aromatic compound having a defined axis oriented substantially normal to the plane of the monolayer, with the monomers forming the monolayer being covalently attached at one axial end to the substrate, and
   a second monomolecular layer composed of monomers of a second selected polycyclic aromatic compound having a defined axis oriented substantially normal to the plane of the monolayer, with the monomers forming the monolayer being covalently attached at one axial end to an axial end of molecules forming the first monolayer.

2. A multilayered structure according to claim 1 wherein said axis is a z axis and each of the monomolecular layers being characterized by in-plane ordering.

3. A multilayered structure according to claim 1 wherein said selected polycyclic aromatic compound is planar.

4. A multi-layered structure according to claim 1, wherein the monomers in the first monolayer are covalently attached to molecules in the second monolayer through bifunctional reagent molecules forming a monomolecular coupling layer between the two layers formed of polycyclic aromatic compounds.

5. A multi-layered structure according to claim 4 including a bifunctional reagent that is electrically conducting.

6. A multi-layered structure according to claim 5 wherein the electrically conducting bifunctional reagent is selected from oligothiophene and oligoaniline.

7. The multilayered structure of claim 4 including a bifunctional reagent that is electrically insulating.

8. The multilayered structure of claim 5 wherein the electrically insulating bifunctional reagent is selected from —$(CH_2)_n$—, where n is between 1 and 5, and $\Phi$—$(CH_2)_n$-$\Phi$, where n is between 0 and 5 and $\Phi$ represents a phenyl.

9. A multilayered structure according to claim 1, which includes a first number of layers of a first selected polycyclic compound and a second number of layers of a second selected polycyclic compound.

10. A multilayered structure according to claim 9, wherein the first and second polycyclic compounds are perylene and naphthalene tetracarboxylic-dianhydride compounds, respectively.

11. The multilayered structure of claim 9, wherein the selected compound is formed by polycyclic compound having axial amine groups, and the bifunctional reagent is a bismaleimide compound.

12. The composition of claim 11, wherein the selected compound is a diamino carbozole.

* * * * *

UNITED STATES PATENT AND TRADEMARK OFFICE
CERTIFICATE OF CORRECTION

PATENT NO. : 6,808,803 B1
APPLICATION NO. : 10/600641
DATED : October 26, 2004
INVENTOR(S) : Shlomo Yitzchaik Page 1 of 1

It is certified that error appears in the above-identified patent and that said Letters Patent is hereby corrected as shown below:

Column 14, line 52 (claim 1, line 3), delete "metallic"
Column 16, line 15 (claim 12, line 1), delete "composition"
and insert therefor --multilayered structure--

Signed and Sealed this

Twelfth Day of December, 2006

JON W. DUDAS
*Director of the United States Patent and Trademark Office*